United States Patent [12]
Lee et al.

(10) Patent No.: US 11,088,710 B2
(45) Date of Patent: Aug. 10, 2021

(54) MEMORY CONTROLLERS AND MEMORY SYSTEMS INCLUDING THE SAME

(71) Applicant: Samsung Electronics Co., Ltd., Suwon-si (KR)

(72) Inventors: Kijun Lee, Ansan-si (KR); Chanki Kim, Seoul (KR); Sunghye Cho, Hwaseong-si (KR); Myungkyu Lee, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/809,949

(22) Filed: Mar. 5, 2020

(65) Prior Publication Data
US 2021/0083687 A1 Mar. 18, 2021

(30) Foreign Application Priority Data
Sep. 17, 2019 (KR) .................. 10-2019-0114283

(51) Int. Cl.
H03M 13/15 (2006.01)
H03M 13/11 (2006.01)
G06F 17/16 (2006.01)

(52) U.S. Cl.
CPC ........ H03M 13/1575 (2013.01); G06F 17/16 (2013.01); H03M 13/1105 (2013.01); H03M 13/118 (2013.01); H03M 13/1168 (2013.01)

(58) Field of Classification Search
CPC .................................................. H03M 13/1575
See application file for complete search history.

(56) References Cited

U.S. PATENT DOCUMENTS

| | | | |
|---|---|---|---|
| 6,915,478 B2 | 7/2005 | Cox | |
| 7,028,245 B2 | 4/2006 | Zhang | |
| 7,103,830 B1 | 9/2006 | Dong | |
| 7,900,122 B2 | 3/2011 | Shen et al. | |
| 8,296,634 B2 | 10/2012 | Chang et al. | |
| 9,195,551 B2 | 11/2015 | Das et al. | |
| 10,236,913 B2 | 3/2019 | Lien et al. | |
| 2012/0198309 A1* | 8/2012 | Alves | G06F 11/10 714/763 |
| 2014/0181618 A1* | 6/2014 | Wu | H03M 13/616 714/761 |
| 2018/0314586 A1 | 11/2018 | Artieri et al. | |

* cited by examiner

Primary Examiner — Joseph D Torres
(74) Attorney, Agent, or Firm — Harness, Dickey & Pierce, P.L.C.

(57) ABSTRACT

A memory controller configured to control a memory module, the memory controller including processing circuitry configured to perform ECC decoding on a read codeword from the memory module using a first portion of a parity check matrix to generate a first syndrome and a second syndrome, determine a type of error in the read codeword based on the second syndrome and a decision syndrome, the decision syndrome corresponding to a sum of the first syndrome and the second syndrome, and output a decoding status flag indicating the type of error.

20 Claims, 19 Drawing Sheets

FIG. 8
OSMb

```
0 0 0 0 0 0 0 0 0 0 0 0 0 0 0 1
1 0 0 0 0 0 0 0 0 0 0 0 0 0 0 1
0 1 0 0 0 0 0 0 0 0 0 0 0 0 0 0
0 0 1 0 0 0 0 0 0 0 0 0 0 0 0 1
0 0 0 1 0 0 0 0 0 0 0 0 0 0 0 0
0 0 0 0 1 0 0 0 0 0 0 0 0 0 0 0
0 0 0 0 0 1 0 0 0 0 0 0 0 0 0 0
0 0 0 0 0 0 1 0 0 0 0 0 0 0 0 0
0 0 0 0 0 0 0 1 0 0 0 0 0 0 0 1
0 0 0 0 0 0 0 0 1 0 0 0 0 0 0 0
0 0 0 0 0 0 0 0 0 1 0 0 0 0 0 0
0 0 0 0 0 0 0 0 0 0 1 0 0 0 0 0
0 0 0 0 0 0 0 0 0 0 0 1 0 0 0 1
0 0 0 0 0 0 0 0 0 0 0 0 1 0 0 0
0 0 0 0 0 0 0 0 0 0 0 0 0 1 0 0
0 0 0 0 0 0 0 0 0 0 0 0 0 0 1 0
```

(p × p)

FIG. 9
ZSM

ISM

$$S_{M0} = \begin{bmatrix} ISM_{1,1} & ZSM_{1,1} & \cdots & ISM_{1,(k+1)} & ZSM_{1,(k+1)} \end{bmatrix} \times r^T$$

(bracketed group labeled $HS_{22}$)

FIG. 16

$$S_D = \begin{bmatrix} ZSM_{2,1} & OSM & \cdots & ZSM_{2,(k+1)} & OSM \end{bmatrix} \times r^T + S_{M0}$$

(bracketed group labeled $HS_{23}$; inner group labeled $S_{MS}$)

| S_D_sub | S_MS_sub | KIND OF ERROR |
|---|---|---|
| = 0 | = 0 | NE |
|  | ≠ 0 | UE |
| ≠ 0 | = 0 | CE |
|  | ≠ 0 |  |

MEMORY CONTROLLERS AND MEMORY SYSTEMS INCLUDING THE SAME

CROSS-REFERENCE TO RELATED APPLICATIONS

This application claims priority under 35 U.S.C. § 119 to Korean Patent Application No. 10-2019-0114283, filed on Sep. 17, 2019, the disclosure of which is incorporated by reference herein in its entirety.

TECHNICAL FIELD

Some example embodiments of the present disclosure relate to memories, and more particularly, to memory controllers and memory systems including the same.

DISCUSSION OF THE RELATED ART

A memory device may be implemented using a semiconductor including, e.g., silicon (Si), germanium (Ge), gallium arsenide (GaAs), indium phosphide (InP), or the like. Memory devices are typically divided into volatile memory devices and nonvolatile memory devices.

A volatile memory device refers to a memory device in which stored data is lost when a power supply is shut down. On the other hand, a nonvolatile memory device refers to a memory device that retains stored data when a power supply is shut down. Because a dynamic random access memory (DRAM), which is a kind of volatile memory device, has a high access speed, the DRAM is widely used as a working memory, a buffer memory, a main memory, or the like of a computing system.

SUMMARY

Some example embodiments provide a memory controller capable of efficiently determining a type of errors occurring in a memory module.

Some example embodiments provide a memory system that includes a memory controller capable of efficiently determining errors occurring in a memory module.

According to some example embodiments, a memory controller is provided configured to control a memory module, the memory controller includes processing circuitry configured to perform ECC decoding on a read codeword from the memory module using a first portion of a parity check matrix to generate a first syndrome and a second syndrome, determine a type of error in the read codeword based on the second syndrome and a decision syndrome, the decision syndrome corresponding to a sum of the first syndrome and the second syndrome, and output a decoding status flag indicating the type of error.

According to some example embodiments, a memory system is provided including a memory module; and a memory controller including processing circuitry, the processing circuitry configured to perform ECC decoding on a read codeword from the memory module using a first portion of a parity check matrix to generate a first syndrome and a second syndrome, determine a type of error in the read codeword based on the second syndrome and a decision syndrome, the decision syndrome corresponding to a sum of the first syndrome and the second syndrome, and output a decoding status flag indicating the type of error.

According to some example embodiments, a memory controller is provided configured to control a memory module, the memory controller comprising: processing circuitry configured to perform ECC encoding on a user data set and meta data to generate error locator parity data, first error magnitude parity data and second error magnitude parity data using a parity generation matrix, output an output codeword to the memory module, the output codeword including the user data set, the meta data, the error locator parity data, the first error magnitude parity data and the second error magnitude parity data, perform ECC decoding on a read codeword from the memory module using a first portion of a parity check matrix to generate a first syndrome and a second syndrome, determine a type of error in the read codeword based on the second syndrome and a decision syndrome, the decision syndrome corresponding to a sum of the first syndrome and the second syndrome, and output a decoding status flag indicating the type of error.

According to some example embodiments, the memory controller may perform an ECC decoding on a read codeword from the memory modules using a first portion of a parity check matrix to generate a first syndrome and a second syndrome, may selectively determine a type of errors in the codeword based on the second syndrome and a decision syndrome corresponding to sum of the first syndrome and the second syndrome. Therefore, the memory controller may increase speed and efficiency of error determining.

BRIEF DESCRIPTION OF THE DRAWINGS

The above and other features of the present disclosure will become more apparent by describing in detail some example embodiments thereof with reference to the accompanying drawings.

FIG. 8 illustrates a base offset sub matrix which is used for generating the offset sub matrixes in the first parity sub matrix.

FIG. 9 illustrates a zero sub matrix in the parity generation matrix in FIG. 7.

FIG. 10 illustrates a unit sub matrix in the parity generation matrix in FIG. 7.

FIG. 15 illustrates an operation of the error magnitude syndrome generator in the ECC decoder of FIG. 14.

FIG. 16 illustrates operations of the shifted error magnitude syndrome generator and the summer in the ECC decoder of FIG. 14.

DETAILED DESCRIPTION

Figure 1:
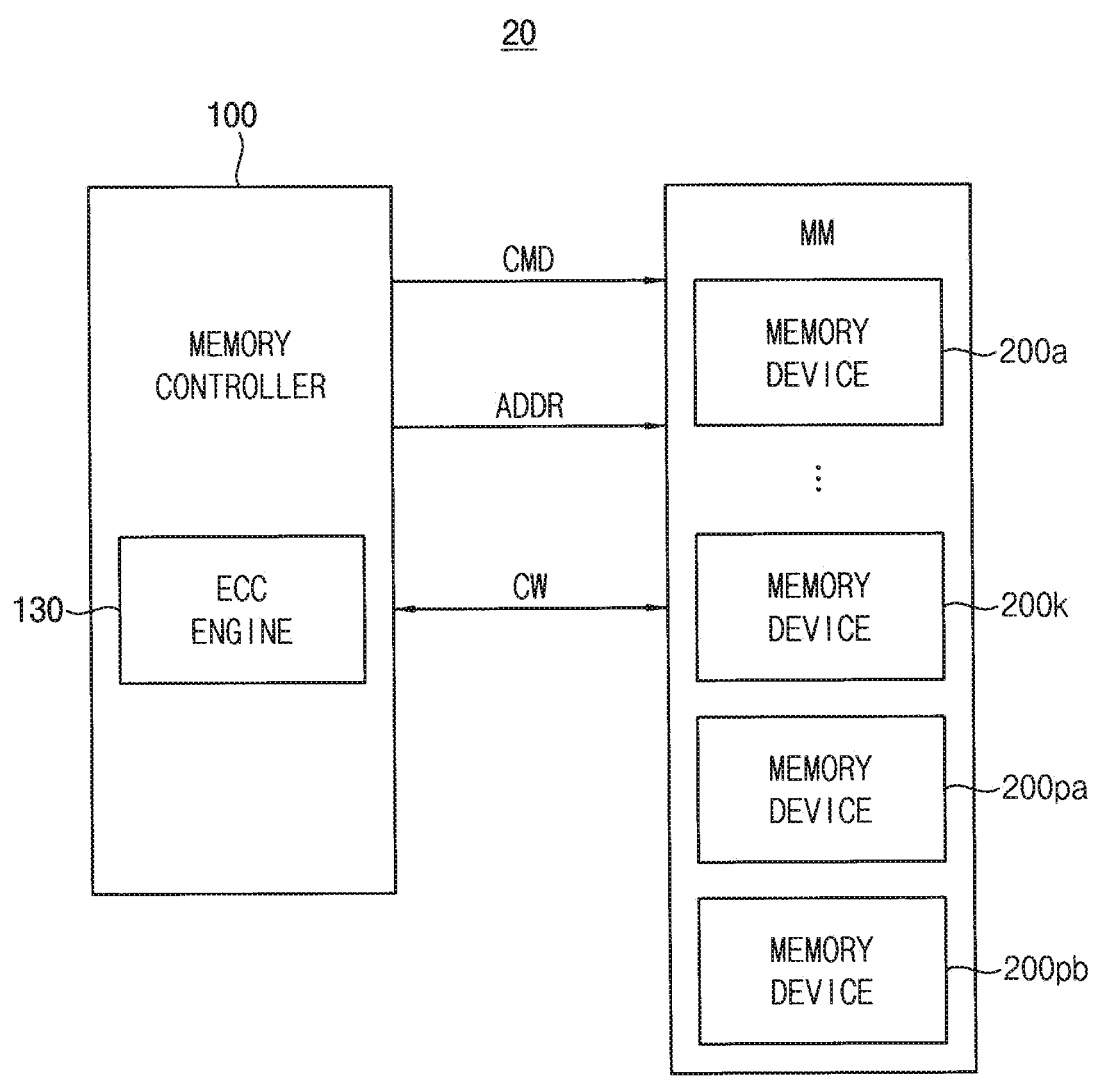
FIG. 1 is a block diagram illustrating a memory system, according to some example embodiments.

Some example embodiments of the present disclosure will be described more fully hereinafter with reference to the accompanying drawings. Like reference numerals may refer to like elements throughout the accompanying drawings.

FIG. 1 is a block diagram illustrating a memory system according to some example embodiments.

Referring to FIG. 1, a memory system 20 may include a memory controller 100 and/or a memory module MM. The memory module MM may include a plurality of memory chips 200a~200k, 200pa and/or 200pb. The plurality of memory chips 200a~200k, 200pa and/or 200pb may include a plurality of data chips 200a~200k, a first parity chip 200pa and/or a second parity chip 200pb.

The memory controller 100 may control an overall operation of the memory system 20. The memory controller 100 may control an overall data exchange between a host and the plurality of memory chips 200a~200k, 200pa and/or 200pb. For example, the memory controller 100 may write data in the plurality of memory chips 200a~200k, 200pa and/or 200pb, and/or read data from the plurality of memory chips 200a~200k, 200pa and/or 200pb, in response to a request from the host. In addition, the memory controller 100 may issue operation commands to the plurality of memory chips 200a~200k, 200pa and/or 200pb for controlling the plurality of memory chips 200a~200k, 200pa and/or 200pb.

In some example embodiments, each of the plurality of memory chips 200a~200k, 200pa and/or 200pb may include volatile memory cells. For example, each of the plurality of memory chips 200a~200k, 200pa and/or 200pb may be implemented as a dynamic random access memory (DRAM).

In some example embodiments, a number of the data chips 200a~200k may be 16. However, the number of the data chips 200a~200k is not limited thereto. In some example embodiments, each of the data chips 200a~200k may be referred to as a data memory, and each of the parity chips 200pa and 200pb may be referred to as an error correction code (ECC) memory, or a redundant memory.

The memory controller 100 may transmit an address ADDR and/or a command CMD to the memory module MM, and/or may exchange a codeword CW from the memory module MM.

The memory controller 100 may include an error correction code (ECC) engine 130 and the ECC engine 130 may perform an ECC encoding ("performing an ECC encoding" may also be referred to as "performing ECC encoding" or "ECC encoding") on a user data set and/or a meta data to generate a parity data set, and/or may provide the memory module MM with the codeword including the user data set, the meta data and/or the parity data set in a write operation of the memory system 20. The user data set may be stored in the data chips 200a~200k, the meta data and/or a first portion of the parity data set may be stored in the first parity chip 200pa and/or a second portion of the parity data set may be stored in the second parity chip 200pb.

In addition, the ECC engine 130 may to perform an ECC decoding ("performing an ECC decoding" may also be referred to as "performing ECC decoding" or "ECC decoding") on the codeword CW read from the memory module MM using a first portion of the parity check matrix to generate a first syndrome and a second syndrome, may determine a type of errors (may refer to a single error or a plurality of errors, may also be referred to as "a type of error" or "an error type") in the codeword CW based on the second syndrome and a decision syndrome corresponding to sum of the first syndrome and the second syndrome, and/or may output a decoding status flag indicating a result of the determining.

The ECC engine 130 may output the decoding status flag indicating that a user data set of the codeword CW includes a correctable error in response to the decision syndrome having a non-zero logic level, may generate a third syndrome indicating a position of the correctable error based on a second portion of the parity check matrix and the codeword CW and/or may correct the correctable error in the user data set to output a corrected user data set. According to some example embodiments, operations described herein as being performed by the memory controller 100 and/or the ECC engine 130 may be performed by processing circuitry. The term 'processing circuitry,' as used in the present disclosure, may refer to, for example, hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

Since a probability that the codeword CW does not include errors, or the codeword CW includes uncorrectable errors, is much higher than a probability that the codeword CW includes an correctable error, the ECC engine 130 may determine a case that the codeword CW does not include errors or the codeword CW, or includes uncorrectable errors, based on the decision syndrome faster and with less calculation than a case that the codeword CW includes an correctable error. Accordingly, the ECC engine 130 may increase the speed and/or efficiency of error determination.

Figure 2:
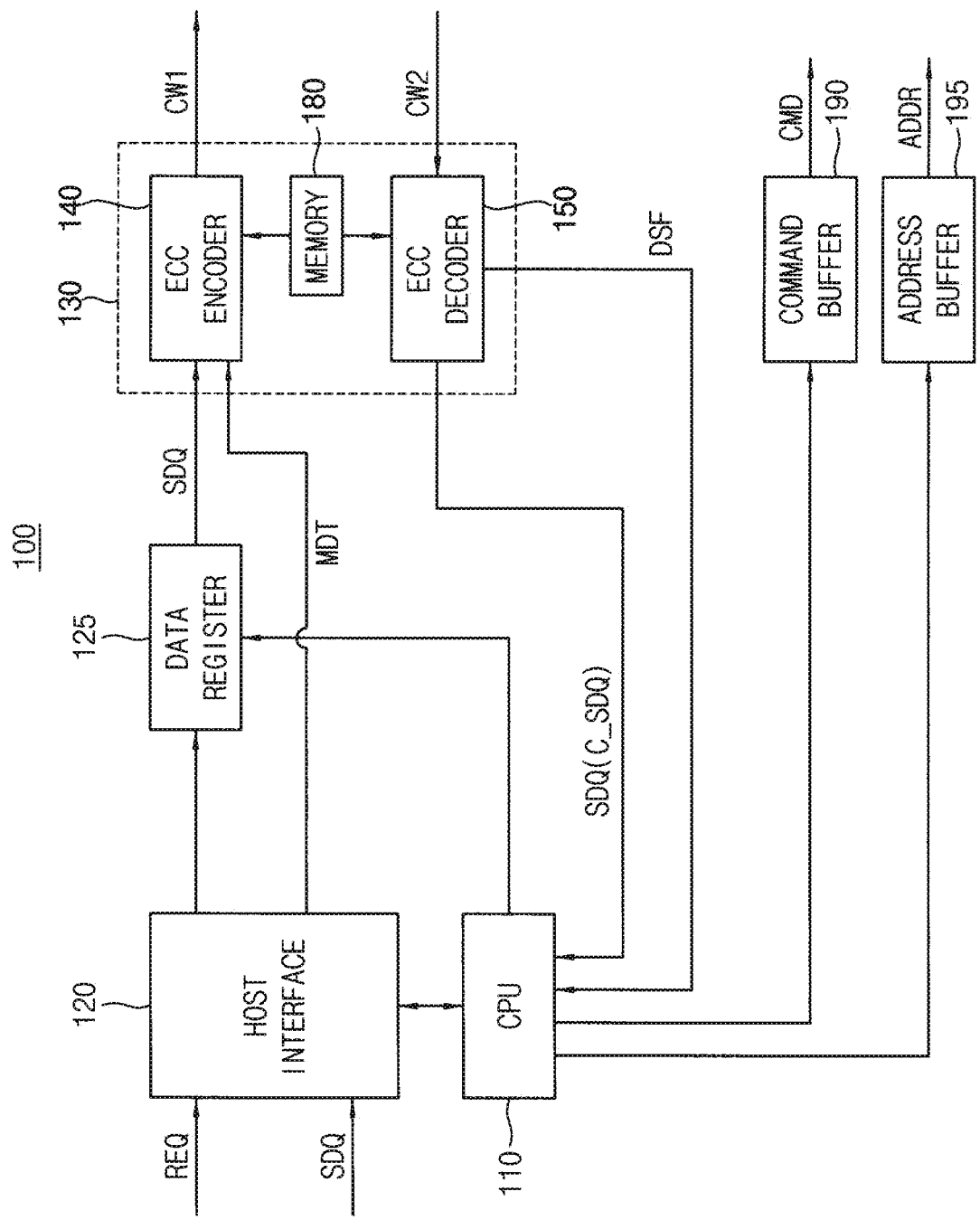
FIG. 2 is block diagram illustrating the memory controller in the memory system of FIG. 1 according to some example embodiments.

FIG. 2 is block diagram illustrating the memory controller in the memory system of FIG. 1 according to some example embodiments.

Referring to FIG. 2, the memory controller 100 may include processing circuitry (e.g., a central processing unit (CPU)) 110 (hereinafter referred to as the CPU 110), a host interface 120, a data register 125, the ECC engine 130, a command buffer 190 and/or an address buffer 195. The ECC engine 130 may include an ECC encoder 140, an ECC decoder 150 and/or a memory 180.

The host interface 120 may receive a request REQ and/or a user data set SDQ from the host, generate meta data MDT associated with the user data set SDQ, provide the user data set SDQ to the data register 125 and/or provide the meta data MDT to the ECC encoder 140. The data register 125 may continuously (or sequentially) output the user data set SDQ to the ECC engine 130.

The ECC encoder 140 may perform an ECC encoding on the user data set SDQ and the meta data MDT using a parity generation matrix to generate a first codeword CW1. The ECC decoder 150 may output a decoding status flag DSF to the CPU 110 using a portion of a parity check matrix, and/or provide the CPU 110 with one of the user data set SDQ and/or a corrected user data set C_SDQ using the parity check matrix. The memory 180 may store the parity generation matrix and the parity check matrix.

The CPU 110 may receive the user data set SDQ or the corrected user data set C_SDQ and/or control the host interface 120, the data register 125, the ECC engine 130, the command buffer 190 and/or the address buffer 195. The command buffer 190 may store the command CMD corresponding to the request REQ and transmit the command CMD to the memory module MM under control of the CPU 110. The address buffer 195 may store the address ADDR and transmit the address ADDR to the memory module MM under control of the CPU 110.

Figure 3:
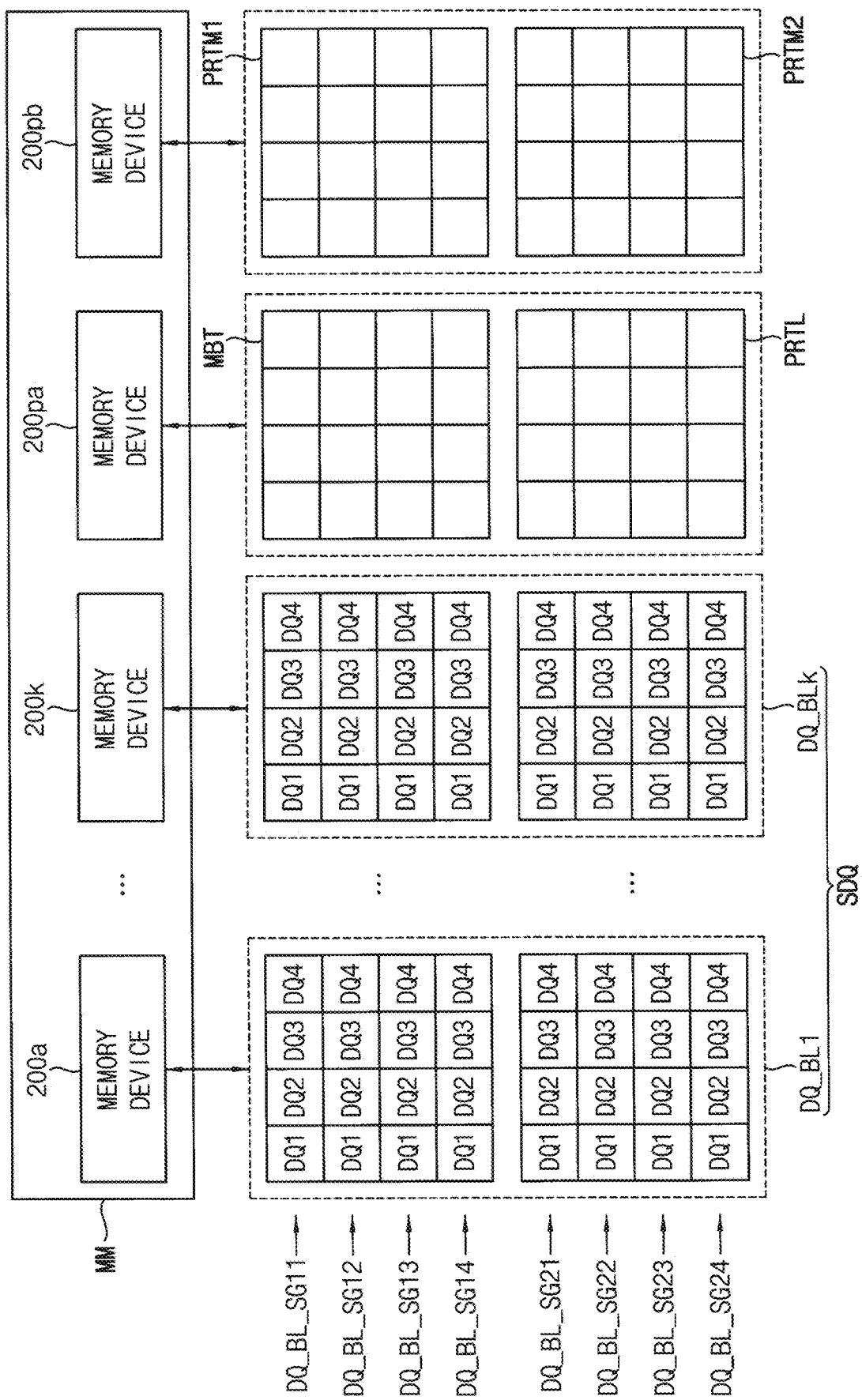
FIG. 3 illustrates data sets corresponding to the plurality of burst lengths in the memory system of FIG. 1, according to some example embodiments.

FIG. 3 illustrates data sets corresponding to the plurality of burst lengths in the memory system of FIG. 1, according to some example embodiments.

Referring to FIG. 3, each of the data chips 200a~200k, and the parity chips 200pa and 200pb, may perform a burst operation. Herein, the burst operation refers to an operation of writing or reading a large amount of data by sequentially increasing or decreasing an initial address provided from the memory controller 100. A basic unit of the burst operation may be referred to as a burst length BL.

Referring to FIG. 3, each of the data sets DQ_BL1~DQ_BLk corresponding to the plurality of burst lengths may be input to/output from each of the data chips 200a~200k, respectively.

Each of the data sets DQ_BL1~DQ_BLk may include data segments DQ_BL_SG11~DQ_BL_SG14 and DQ_BL_SG21~DQ_BL_SG24 corresponding to each burst length of the plurality of burst lengths. The data sets DQ_BL1~DQ_BLk may correspond to the user data set SDQ. The burst length is assumed to be 4 in FIG. 3 and it is assumed that the burst operation is performed two times. While the burst operation is performed two times in each of the data chips 200a~200k, the meta data MBT and an error locator parity data PRTL corresponding to the plurality of burst lengths may be input to/output from are input to/output from the first parity chip 200pa, and a first error magnitude parity data PRTM1 and a second error magnitude parity data PRTM1 corresponding to the plurality of burst lengths may be input to/output from are input to/output from the second parity chip 200pb.

Figure 4:
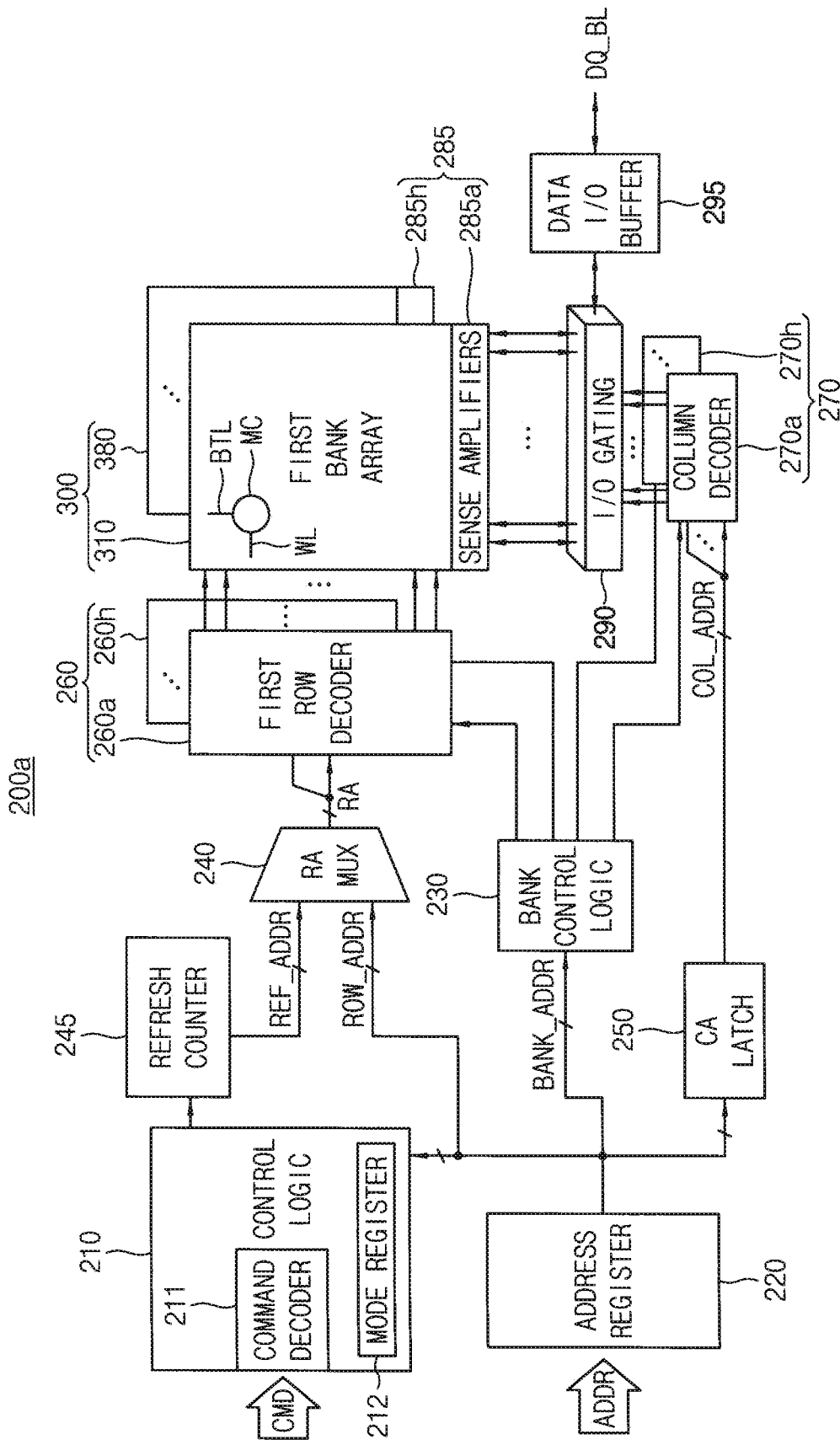
FIG. 4 is a block diagram illustrating one of the data chips in the memory module of FIG. 1 according to some example embodiments.

FIG. 4 is a block diagram illustrating one of the data chips in the memory module of FIG. 1 according to some example embodiments.

Referring to FIG. 4, the data chip 200a may include a control logic circuit 210, an address register 220, a bank control logic circuit 230, a row address multiplexer 240, a column address latch 250, a row decoder 260, a column decoder 270, a memory cell array 300, a sense amplifier unit 285, an input/output (I/O) gating circuit 290, a data input/output (I/O) buffer 295 and/or a refresh counter 245.

The memory cell array 300 may include first through eighth bank arrays 310~380 (e.g., first through eighth bank arrays 310, 320, 330, 340, 350, 360, 370 and 380).

The row decoder 260 may include first through eighth bank row decoders 260a~260h coupled to the first through eighth bank arrays 310~380, respectively, the column decoder 270 may include first through eighth bank column decoders 270a~270h coupled to the first through eighth bank arrays 310~380, respectively, and the sense amplifier unit 285 may include first through eighth bank sense amplifiers 285a~285h coupled to the first through eighth bank arrays 310~380, respectively.

The first through eighth bank arrays 310~380, the first through eighth bank row decoders 260a~260h, the first through eighth bank column decoders 270a~270h, and the first through eighth bank sense amplifiers 285a~285h may form first through eighth banks. Each of the first through eighth bank arrays 310~380 may include a plurality of word-lines WL, a plurality of bit-lines BL, and a plurality of memory cells MC formed at intersections of the word-lines WL and the bit-lines BTL.

Although the data chip 200a is illustrated in FIG. 4 as including eight banks, the data chip 200a may include any number of banks.

The address register 220 may receive the address ADDR including a bank address BANK_ADDR, a row address ROW_ADDR, and a column address COL_ADDR from the memory controller 100. The address register 220 may provide the received bank address BANK_ADDR to the bank control logic circuit 230, may provide the received row address ROW_ADDR to the row address multiplexer 240, and may provide the received column address COL_ADDR to the column address latch 250.

The bank control logic circuit 230 may generate bank control signals in response to the bank address BANK_ADDR. One of the first through eighth bank row decoders 260a~260h corresponding to the bank address BANK_ADDR may be activated in response to the bank control signals, and one of the first through eighth bank column decoders 270a~270h corresponding to the bank address BANK_ADDR may be activated in response to the bank control signals.

The row address multiplexer 240 may receive the row address ROW_ADDR from the address register 220, and may receive a refresh row address REF_ADDR from the refresh counter 245. The row address multiplexer 240 may selectively output the row address ROW_ADDR or the refresh row address REF_ADDR as a row address RA. The row address RA that is output from the row address multiplexer 240 may be applied to the first through eighth bank row decoders 260a~260h.

The activated one of the first through eighth bank row decoders 260a~260h may decode the row address RA that is output from the row address multiplexer 240, and may activate a word-line WL corresponding to the row address RA. For example, the activated bank row decoder may generate a word-line driving voltage and may apply the word-line driving voltage to the word-line WL corresponding to the row address RA.

The column address latch 250 may receive the column address COL_ADDR from the address register 220, and may temporarily store the received column address COL_ADDR. In some example embodiments, in a burst mode, the column address latch 250 may generate column addresses that increment from the received column address COL_ADDR. The column address latch 250 may apply the temporarily stored or generated column address to the first through eighth bank column decoders 270a~270h.

The activated one of the first through eighth bank column decoders 270a~270h may decode the column address COL_ADDR that is output from the column address latch 250, and may control the I/O gating circuit 290 to output data corresponding to the column address COL_ADDR.

The I/O gating circuit 290 may include circuitry for gating input/output data. The I/O gating circuit 290 may further include read data latches for storing data that is output from the first through eighth bank arrays 310~380, and write control devices for writing data to the first through eighth bank arrays 310~380.

Data to be read from one of the first through eighth bank arrays 310~380 may be sensed by a sense amplifier coupled to the one bank array from which the data is to be read, and may be stored in the read data latches.

The data stored in the read data latches may be provided to the memory controller 100 via the data I/O buffer 295 after the ECC engine 130 performs an ECC decoding on the data (e.g., a codeword CW). Data set DQ_BL to be written in one of the first through eighth bank arrays 310~380 may be provided to the data I/O buffer 295 from the memory controller 100. The data I/O buffer 295 may provide the data set DQ_BL to the I/O gating circuit 290.

The control logic circuit 210 may control operations of the data chip 200a. For example, the control logic circuit 210 may generate control signals for the data chip 200a to perform the write operation and/or the read operation. The control logic circuit 210 may include a command decoder 211 that decodes the command CMD received from the memory controller 100 and a mode register 212 that sets an operation mode of the data chip 200a. According to some example embodiments, operations described herein as being performed by the control logic circuit 210 may be performed by processing circuitry.

Each of the parity chips 200pa and 200pb may have the same or substantially the same configuration as the data chip 200a. Each of the parity chips 200pa and 200pb may input/output a corresponding parity data.

Figure 5:
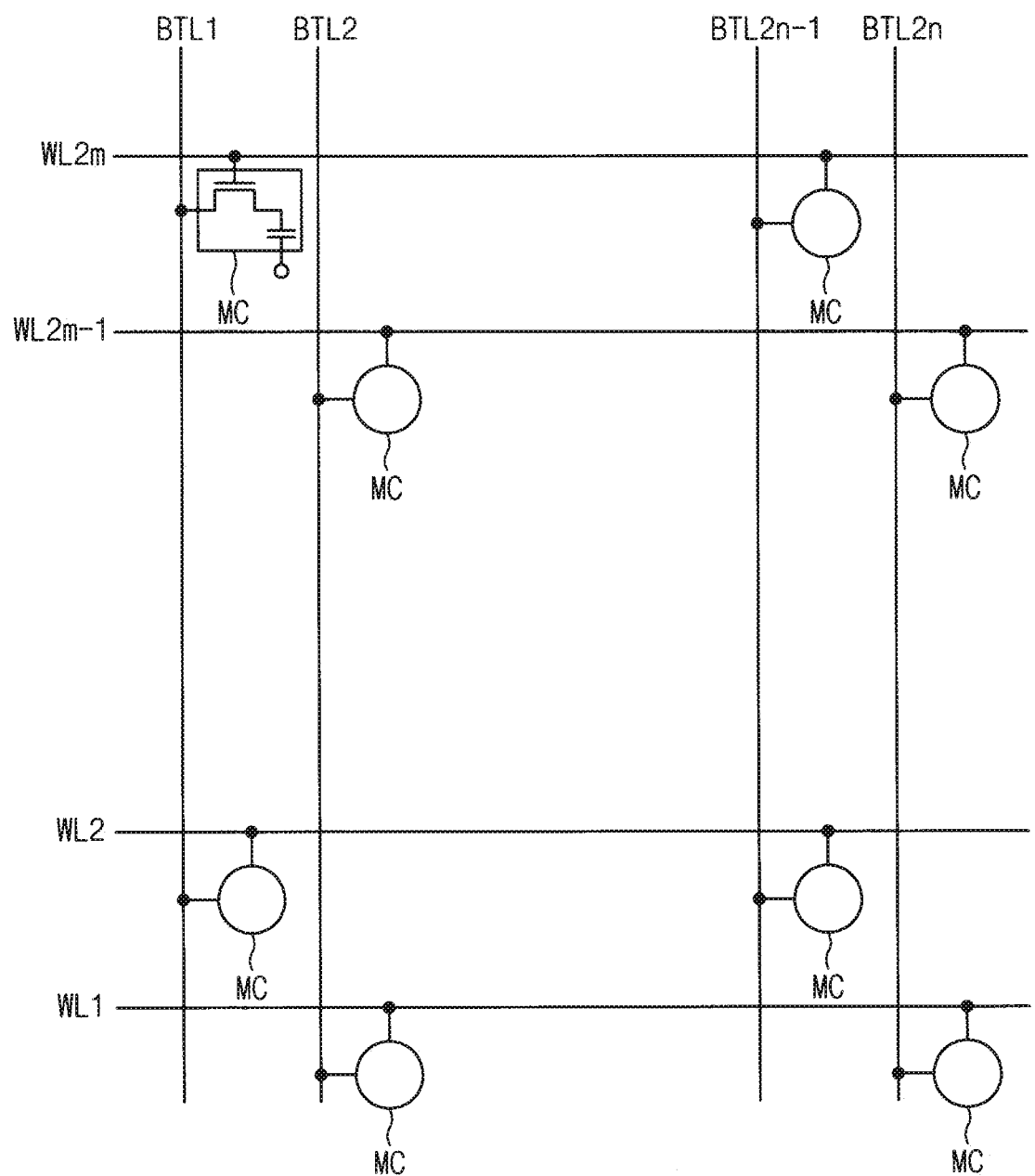
FIG. 5 illustrates a first bank array of the data chip of FIG. 4 according to some example embodiments.

FIG. 5 illustrates a first bank array of the data chip of FIG. 4 according to some example embodiments.

Referring to FIG. 5, the first bank array 310 includes a plurality of word-lines WL1~WL2m (where m is a natural number greater than two), a plurality of bit-lines BTL1~BTL2n (where n is a natural number greater than two), and a plurality of memory cells MCs disposed near intersections between the word-lines WL1~WL2m and the bit-lines BTL1~BTL2n. In some example embodiments, each of the plurality of memory cells MCs may include a DRAM cell structure. The plurality of word-lines WL1~WL2m to which the plurality of memory cells MCs are connected may be referred to as rows of the first bank array 310 and the plurality of bit-lines BL1~BL2n to which the plurality of memory cells MCs are connected may be referred to as columns of the first bank array 310.

Figure 6:
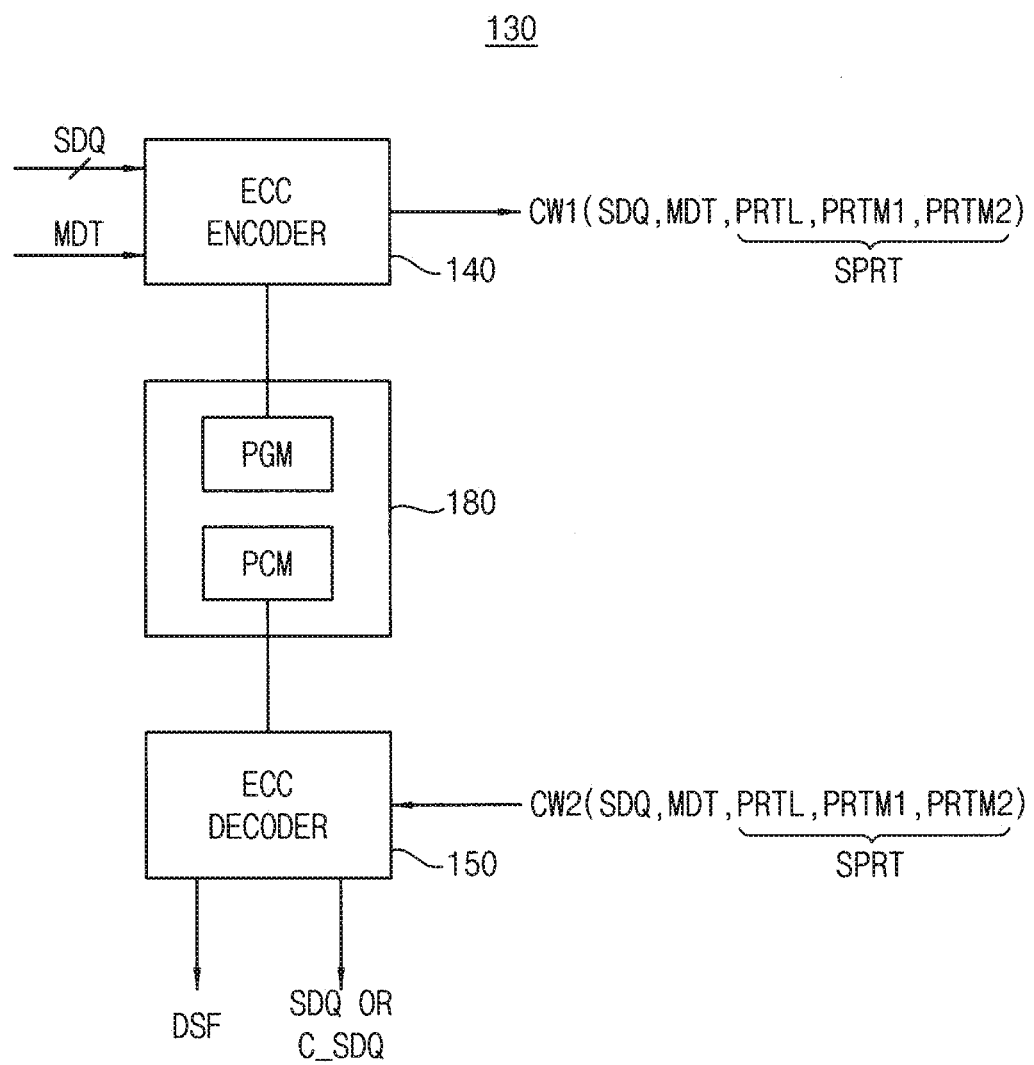
FIG. 6 is a block diagram illustrating an example of the ECC engine in FIG. 2 according to some example embodiments.

FIG. 6 is a block diagram illustrating an example of the ECC engine in FIG. 2 according to some example embodiments.

Referring to FIG. 6, the ECC engine 130 includes an ECC encoder 140, an ECC decoder 150 and/or a memory 180. The memory 180 may be referred to as an ECC memory 180.

The memory 180 is connected to the ECC encoder 140 and/or the ECC decoder 150 and may store a parity generation matrix PGM and/or a parity check matrix PCM.

The ECC encoder 140 may perform an ECC encoding on the user data set SDQ and the meta data MBT by using the parity generation matrix PCM to generate a parity data set SPRT including an error locator parity data PRTL, a first error magnitude parity data PRTM1 and a second error magnitude parity data PRTM2 and may output a codeword CW1 including the user data set SDQ, the meta data MBT and the parity data set SPRT.

The ECC decoder 150 may receive a codeword CW2 including the user data set SDQ, the meta data MBT and the parity data set SPRT from the memory module MM. The ECC decoder 150 may perform an ECC decoding on the codeword CW2 by using a first portion of the parity check matrix PCM to generate a decoding status flag DSF indicating the user data set SDQ includes a correctable error while outputting the user data set SDQ.

The ECC decoder 150 may correct an error in the user data set SDQ by using a second portion of the parity check matrix PCM in response to the decoding status flag DSF indicating the user data set SDQ includes the correctable error and may output the corrected user data set C_SDQ.

Figure 7:
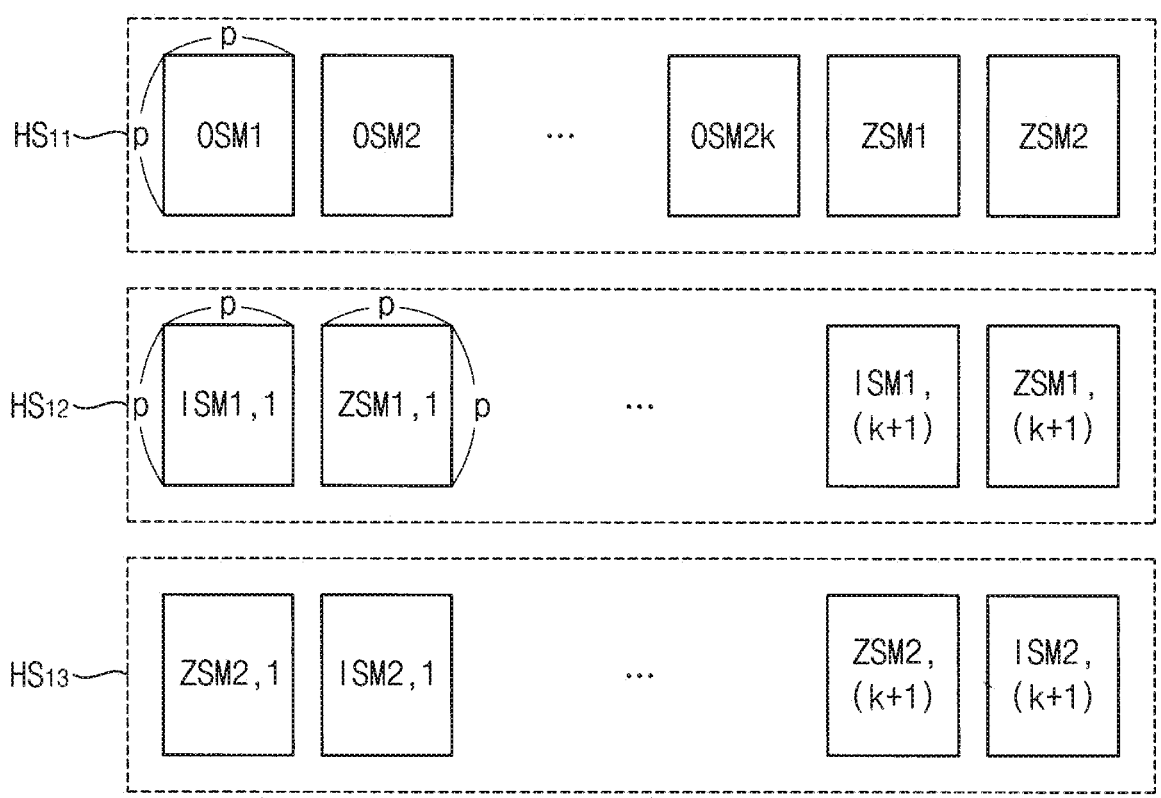
FIG. 7 illustrates a parity generation matrix stored in the memory in the ECC engine of FIG. 6.

FIG. 7 illustrates a parity generation matrix stored in the memory in the ECC engine of FIG. 6.

Referring to FIG. 7, the parity generation matrix PGM may include a first parity sub matrix $HS_{11}$, a second parity sub matrix $HS_{12}$ and/or a third parity sub matrix $HS_{13}$.

The first parity sub matrix $HS_{11}$ includes a plurality of offset sub matrixes OSM1~OSM2k corresponding to the data chips 200a~200k, and two zero sub matrixes ZSM1 and ZSM2 corresponding to the parity chips 200pa and 200pb. Each of the offset sub matrixes OSM1~OSM2k and the zero sub matrixes ZSM1 and ZSM2 includes p×p elements (p is a natural number greater than one).

The second parity sub matrix $HS_{12}$ includes a plurality of unit sub matrixes ISM1,1~ISM1,(k+1) and a plurality of zero sub matrixes ZSM1,1~ZSM1,(k+1). Each of the unit sub matrixes ISM1,1~ISM1,(k+1) and the zero sub matrixes ZSM1,1~ZSM1,(k+1) includes p×p elements. In addition, the unit sub matrixes ISM1,1~ISM1,(k+1) and the zero sub matrixes ZSM1,1~ZSM1,(k+1) are alternatingly arranged (e.g., arranged or positioned in an alternating order).

The third parity sub matrix $HS_{13}$ includes a plurality of zero sub matrixes ZSM2, 1~ZSM2,(k+1) and a plurality of unit sub matrixes ISM2,1~ISM2,(k+1). Each of the zero sub matrixes ZSM2,1~ZSM2,(k+1) and the unit sub matrixes ISM2,1~ISM2,(k+1) includes p×p elements. In addition, the zero sub matrixes ZSM2,1~ZSM2,(k+1) and the unit sub matrixes ISM2,1~ISM2,(k+1) are alternatingly arranged.

Figures 8, 9:
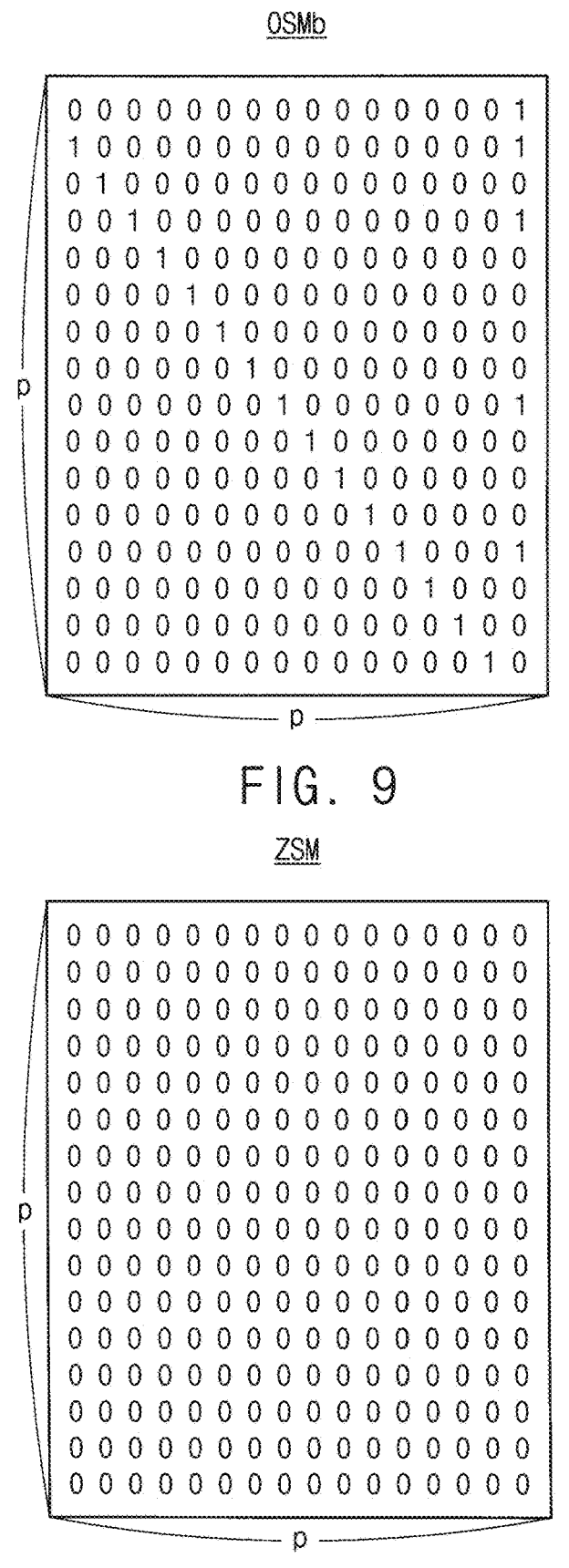

FIG. 8 illustrates a base offset sub matrix which may be used for generating the offset sub matrixes in the first parity sub matrix.

Referring to FIG. 8, a base offset sub matrix OSMb may include (p+3) high level elements. The base offset sub matrix OSMb may be obtained based on a primitive polynomial such as $x^{16}+x^{12}+x^3+x+1$. If a p-th order primitive polynomial is varied, elements of each of the offset sub matrixes OSM1~OSM2k may be varied.

The offset sub matrix OSM1 of the offset sub matrixes OSM1~OSM2k may be obtained by powers of the base offset sub matrix OSMb. The offset sub matrix OSM2 of the offset sub matrixes OSM1~OSM2k may be obtained by multiplying the offset sub matrix OSM1 and a sub matrix obtained by powers of the base offset sub matrix OSMb by an offset.

In addition, a gap between two offset sub matrixes OSM (2i−1) and OSM(2i) associated with one (memory) chip of the offset sub matrixes OSM1~OSM2k may be regular. Here, i is one of one through eight. That is, the offset sub matrix OSM4 may be obtained by multiplying the offset sub matrix OSM3 and a sub matrix obtained by powers of the base offset sub matrix OSMb by an offset.

FIG. 9 illustrates a zero sub matrix in the parity generation matrix in FIG. 7.

Referring to FIG. 9, in a zero sub matrix ZSM corresponding to each of the zero sub matrixes ZSM1 and ZSM2, the zero sub matrixes ZSM1,1~ZSM1,(k+1) and the zero sub matrixes ZSM2,1~ZSM2,(k+1), each of elements has a zero.

FIG. 10 illustrates a unit sub matrix in the parity generation matrix in FIG. 7.

Referring to FIG. 10, a unit sub matrix ISM corresponding to each of the unit sub matrixes ISM1,1~ISM1,(k+1) and the ISM2,1~ISM2,(k+1) includes p high level elements disposed in a diagonal direction. Each of other elements except the high level elements has a zero.

In FIGS. 7 through 10, p may correspond to 16 and may correspond to a number of bits of the data set DQ_BL which are input to/output from each of the data chips 200a~200k during one burst operation. In addition, a number of non-zero elements in the first parity sub matrix $HS_{11}$ may be greater than a number of non-zero elements in the second parity sub matrix $HS_{12}$ or a number of non-zero elements in the third parity sub matrix $HS_{13}$.

Figure 11:
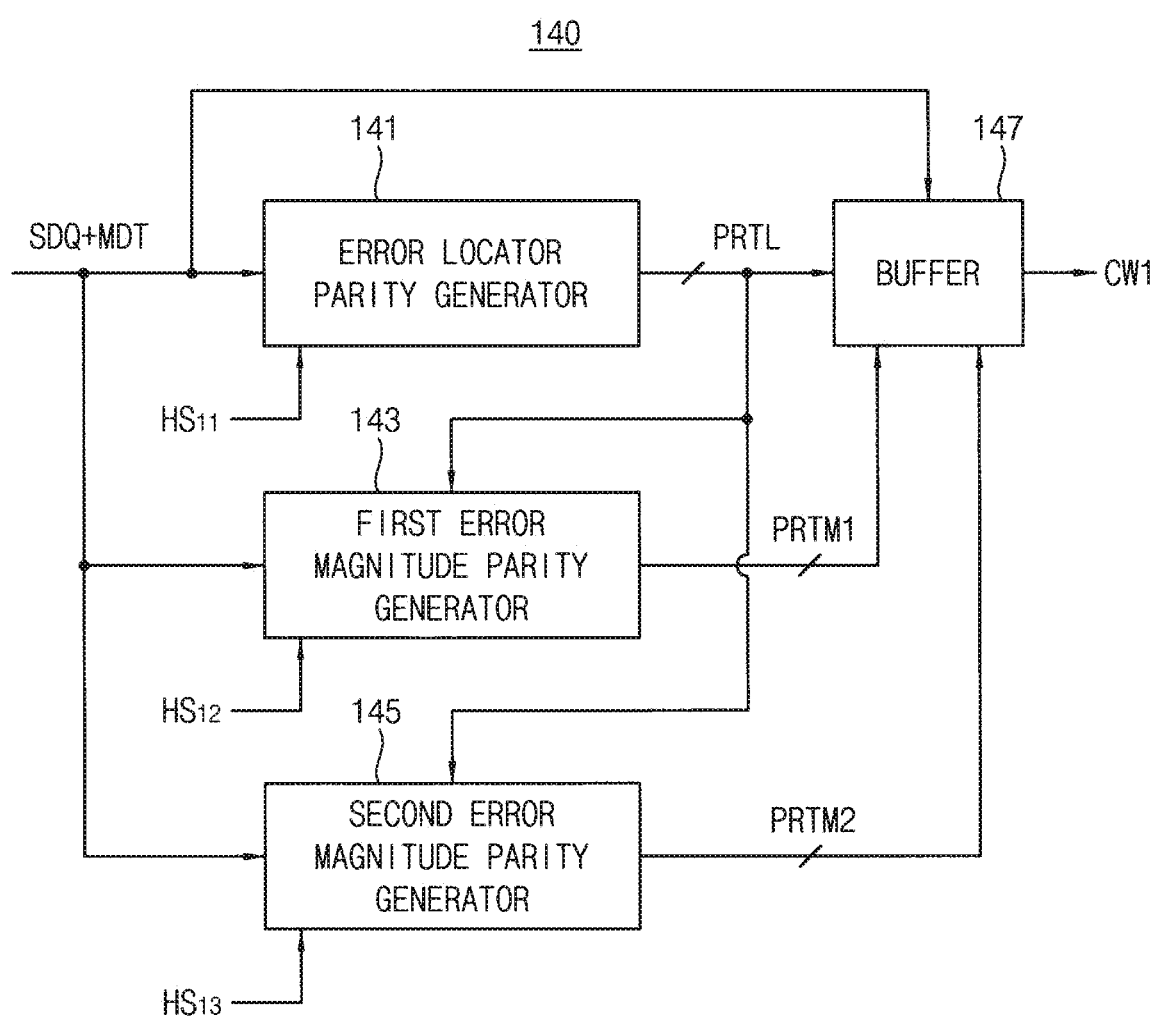
FIG. 11 illustrates an example of the ECC encoder in the ECC engine of FIG. 6 according to some example embodiments.

FIG. 11 illustrates an example of the ECC encoder in the ECC engine of FIG. 6 according to some example embodiments.

Referring to FIG. 11, the ECC encoder 140 includes an error locator parity generator 141, a first error magnitude parity generator 143, a second error magnitude parity generator 145 and/or a buffer 147. According to some example embodiments, operations described herein as being performed by the ECC encoder 140, the error locator parity generator 141, the first error magnitude parity generator 143, the second error magnitude parity generator 145 and/or the buffer 147 (e.g., providing the memory module MM with the codeword CW1) may be performed by processing circuitry.

The error locator parity generator 141 may perform an ECC encoding on the user data set SDQ and the meta data MDT by using the first parity sub matrix $HS_{11}$ to generate the error locator parity data PRTL which may be used for determining locations of errors, and provide the error locator parity data PRTL to the buffer 147.

The error locator parity generator 141 may generate the error locator parity data PRTL by performing a matrix-multiplication operation on the user data set SDQ and the meta data MDT with the first parity sub matrix $HS_{11}$. If a vector representation of the user data set SDQ and the meta data MDT corresponds to ms and a vector representation of the error locator parity data PRTL corresponds to $p_L$, $p_L = HS_{11} [ms\ 0]^T$. Here, T represents a transposed matrix and 0 represents a zero matrix.

The first error magnitude parity generator 143 may perform an ECC encoding on the user data set SDQ, the meta data MDT and the error locator parity data PRTL by using the second parity sub matrix $HS_{12}$ to generate the first error magnitude parity data PRTM1 which may be used for determining a number of errors, and provide the first error magnitude parity data PRTM1 to the buffer 147.

The first error magnitude parity generator 143 may generate the first error magnitude parity data PRTM1 by performing a matrix-multiplication operation on the user data set SDQ, the meta data MDT and the error locator parity data PRTL with the second parity sub matrix $HS_{12}$. If a vector representation of the first error magnitude parity data PRTM1 corresponds to $p_{M1}$, $p_{M1} = HS_{12} [ms\ p_L\ 0]^T$.

The second error magnitude parity generator 145 may perform an ECC encoding on the user data set SDQ, the meta data MDT and the error locator parity data PRTL by using the third parity sub matrix $HS_{13}$ to generate the second error magnitude parity data PRTM2 which may be used for determining a number of errors, and provide the second error magnitude parity data PRTM2 to the buffer 147.

The second error magnitude parity generator 145 may generate the second error magnitude parity data PRTM2 by performing a matrix-multiplication operation on the user data set SDQ, the meta data MDT and the error locator parity data PRTL with the third parity sub matrix HS 13. If a vector representation of the second error magnitude parity data PRTM2 corresponds to $p_{M2}$, $p_{M2} = HS_{13} [ms\ p_L\ 0]^T$.

The buffer 147 may receive the user data set SDQ, the meta data MDT, the error locator parity data PRTL, the first error magnitude parity data PRTM1 and the second error magnitude parity data PRTM2, and provide the memory module MM with the codeword CW1 (also referred to as an output codeword CW1 or a write codeword CW1) including the user data set SDQ, the meta data MDT, the error locator parity data PRTL, the first error magnitude parity data PRTM1 and the second error magnitude parity data PRTM2.

Figure 12:
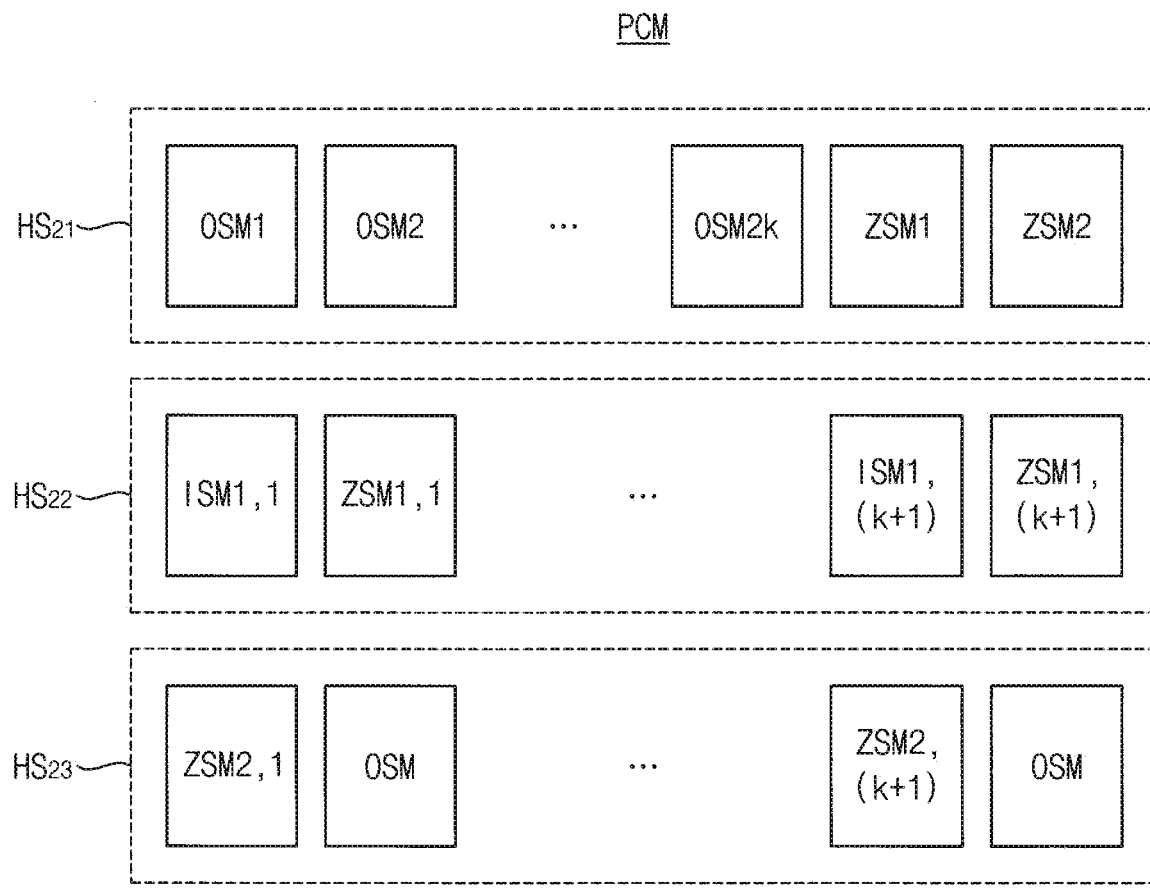
FIG. 12 illustrates a parity check matrix stored in the memory in the ECC engine of FIG. 6.

FIG. 12 illustrates a parity check matrix stored in the memory in the ECC engine of FIG. 6.

Referring to FIG. 12, the parity check matrix PCM may include a first parity sub matrix $HS_{21}$, a second parity sub matrix $HS_{22}$ and a third parity sub matrix $HS_{23}$.

The first parity sub matrix $HS_{21}$ includes a plurality of offset sub matrixes OSM1~OSM2k corresponding to the data chips 200a~200k, and two zero sub matrixes ZSM1 and ZSM2 corresponding to the parity chips 200pa and 200pb. Each of the offset sub matrixes OSM1~OSM2k, and the zero sub matrixes ZSM1 and ZSM2, includes p×p elements.

The second parity sub matrix $HS_{22}$ includes a plurality of unit sub matrixes ISM1,1~ISM1,(k+1) and a plurality of zero sub matrixes ZSM1,1~ZSM1,(k+1). Each of the unit sub matrixes ISM1,1~ISM1,(k+1) and the zero sub matrixes ZSM1,1~ZSM1,(k+1) includes p×p elements. In addition, the unit sub matrixes ISM1,1~ISM1,(k+1) and the zero sub matrixes ZSM1,1~ZSM1,(k+1) are alternatingly arranged.

The third parity sub matrix $HS_{23}$ includes a plurality of zero sub matrixes ZSM2,1~ZSM2,(k+1) and a plurality of offset sub matrixes OSM. Each of the zero sub matrixes ZSM2,1~ZSM2,(k+1) and the offset sub matrixes OSM includes p×p elements. In addition, the zero sub matrixes ZSM2,1~ZSM2,(k+1) and the offset sub matrixes OSM are alternatingly arranged.

Referring to FIGS. 7 and 12, the first parity sub matrix $HS_{21}$ may be the same as or similar to the first parity sub matrix $HS_{11}$ and the second parity sub matrix $HS_{22}$ may be the same as or similar to the second parity sub matrix $HS_{12}$. The third parity sub matrix $HS_{23}$ may be obtained by linear combination operation on the first parity sub matrix $HS_{11}$, the second parity sub matrix $HS_{12}$ and the third parity sub matrix $HS_{13}$ of the parity generation matrix PGM. Since the linear combination operation on elements in rows of the matrix does not change ECC architecture, the third parity sub matrix $HS_{23}$ may be used as a syndrome. In addition, the ECC encoder 140 and the ECC decoder 150 in FIG. 6 may share the parity generation matrix PGM and perform ECC encoding and ECC decoding, respectively. According to some example embodiments, the parity generation matrix PGM may be equivalent or similar to the parity check matrix PCM in FIG. 6.

Figure 13:
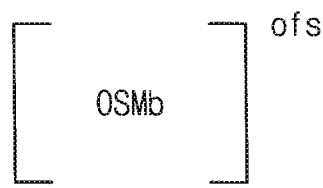
FIG. 13 illustrates an offset sub matrix.

FIG. 13 illustrates an offset sub matrix in FIG. 13.

Referring to FIG. 13, the offset sub matrix OSM may be obtained by powers of the base offset sub matrix OSMb by an offset ofs.

Referring to FIGS. 12 and 13, a number of non-zero elements in the first parity sub matrix $HS_{21}$ may be greater than a number of non-zero elements in the second parity sub matrix $HS_{22}$ or a number of non-zero elements in the third parity sub matrix $HS_{23}$. Therefore, the ECC decoder 150 in FIG. 6 may generate a first syndrome and a second syndrome by using the second parity sub matrix $HS_{22}$ and the third parity sub matrix $HS_{23}$, and determine whether the codeword includes an correctable error based on the first syndrome and the second syndrome prior to determining error positions of the codeword. Accordingly, the ECC decoder 150 may determine errors with greater speed and/or efficiency.

Figure 14:
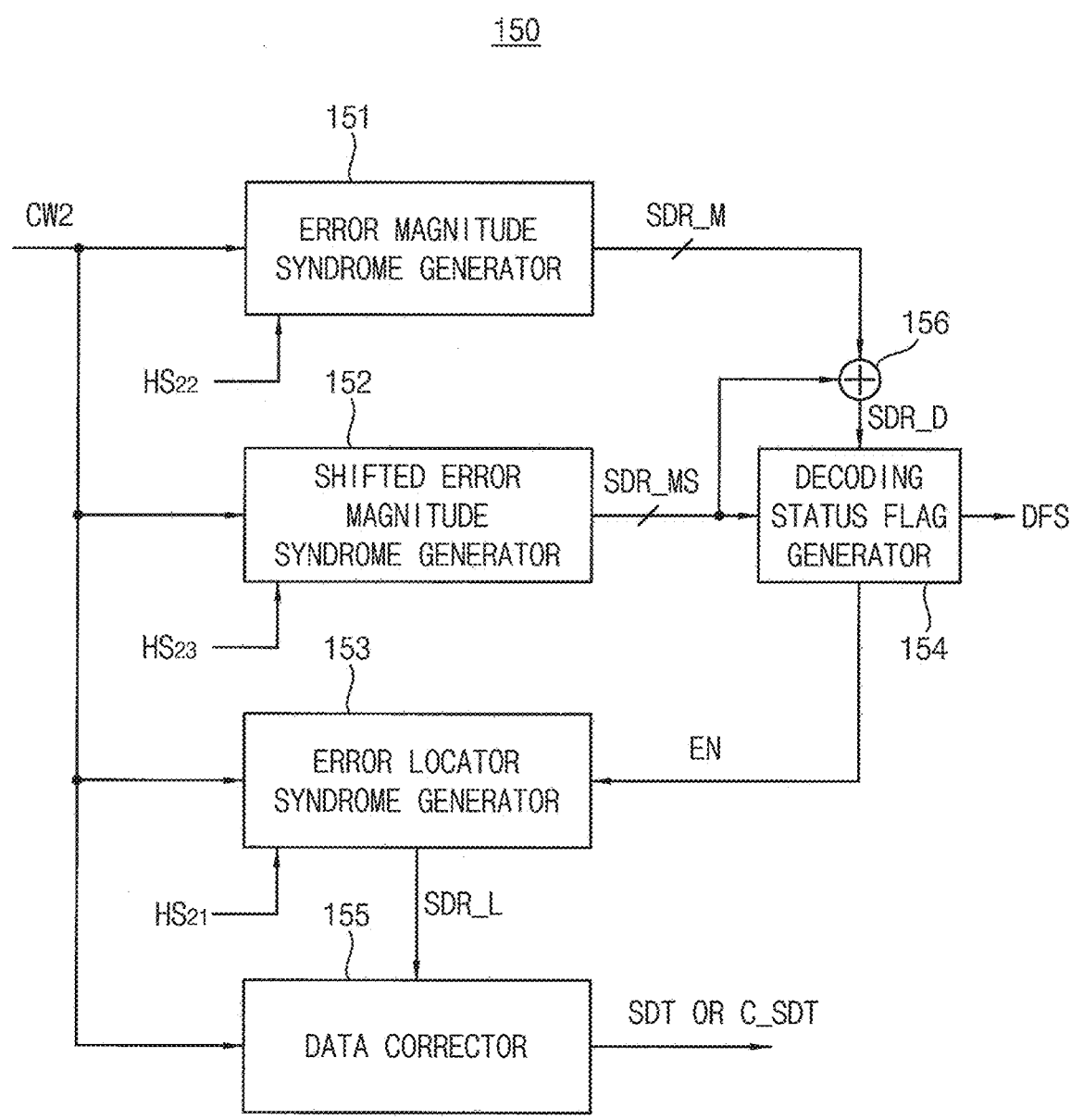
FIG. 14 illustrates an example of the ECC decoder in the ECC engine of FIG. 6 according to some example embodiments.

FIG. 14 illustrates an example of the ECC decoder in the ECC engine of FIG. 6 according to some example embodiments.

Referring to FIG. 14, the ECC decoder 150 includes an error magnitude syndrome generator 151, a shifted error magnitude syndrome generator 152, an error locator syndrome generator 153, a data corrector 155, a summer 156 and/or a decoding status flag generator 154. According to some example embodiments, operations described herein as being performed by the ECC decoder 150, the error magnitude syndrome generator 151, the shifted error magnitude syndrome generator 152, then error locator syndrome generator 153, the data corrector 155, the summer 156 and/or the decoding status flag generator 154 may be performed by processing circuitry.

The error magnitude syndrome generator 151 may generate a first syndrome SDR_M indicating a number of errors by performing a matrix-multiplication operation on the read codeword CW2 and the second parity sub matrix $HS_{22}$. If a vector representation of the read codeword CW2 $r^T$ and a vector representation of the first syndrome SDR_M corresponds to $S_{M0}$, $S_{M0} = HS_{22} r^T$.

The shifted error magnitude syndrome generator 152 may generate a second syndrome SDR_MS indicating a number of errors by performing a matrix-multiplication operation on the read codeword CW2 and the third parity sub matrix $HS_{23}$. If a vector representation of the second syndrome SDR_MS corresponds to $S_{MS}$, $S_{MS} = HS_{23} r^T$. The summer 156 may sum the first syndrome SDR_M and the second syndrome SDR_MS to generate a decision syndrome SDR_D. If a vector representation of the decision syndrome SDR_D corresponds to $S_D$, $S_D = S_{M0} + S_{MS}$.

The decoding status flag generator 154 may generate an enable signal EN and the decoding status flag DSF indicating whether the user data set in the codeword CW2 includes correctable errors based on logic levels of the second syndrome SDR_MS and the decision syndrome SDR_D.

The decoding status flag generator 154 may enable the enable signal EN and may generate the decoding status flag DSF indicating that user data set of the read codeword CW2 includes correctable errors in response to the decision syndrome SDR_D having a non-zero logic level.

The decoding status flag generator 154 may disable the enable signal EN and may generate the decoding status flag DSF indicating that user data set of the read codeword CW2 includes uncorrectable errors or does not include errors in response to the decision syndrome SDR_D having a zero logic level.

The decoding status flag generator 154 may output the decoding status flag DSF indicating that user data set of the read codeword CW2 includes uncorrectable errors in response to the decision syndrome SDR_D having a zero logic level and the second syndrome SDR_MS having a non-zero logic level.

The error locator syndrome generator 153 may be activated in response to the enabled enable signal EN, may generate a third syndrome SDR_L indicating positions of correctable errors in the codeword CW2, and may provide the third syndrome SDR_L to the data corrector 155. If a vector representation of the third syndrome SDR_L corresponds to $S_L$, $S_L = HS_{21} r^T$.

The data corrector 155 may selectively correct the correctable errors in the user data set of the codeword CW2 to output the corrected user data set C_SDQ or the user data set SDQ (e.g., to a device and/or host external to the memory controller (e.g., the memory controller 100) and/or the memory system (e.g., the memory system 20)).

Conventional ECC decoders perform calculations to determine positions of errors detected in codewords regardless of the type of error detected in the codewords. As the probability of a codeword containing a correctable error is lower than the probability of the codeword containing no error or an uncorrectable error, many calculations performed by the conventional ECC decoders to determine positions of errors are unnecessary, resulting in excessive resource consumption (e.g., power consumption, processor usage, etc.) and delay. However, according to some example embodiments, the error locator syndrome generator 153 may be activated to calculate positions of errors by generating the third syndrome SDR_L only when the user data set SDQ includes correctable errors. Accordingly, the unnecessary calculations performed by the conventional ECC decoders are avoided, thereby reducing resource consumption (e.g., power consumption, processor usage, etc.) and delay. Therefore, the ECC decoder 150 may determine and/or correct errors with greater speed and/or efficiency.

FIG. 15 illustrates an operation of the error magnitude syndrome generator in the ECC decoder of FIG. 14.

Referring to FIGS. 14 and 15, the error magnitude syndrome generator 151 may generate the first syndrome SDR_M indicating a number of errors by performing a matrix-multiplication operation on the read codeword CW2 and the second parity sub matrix $HS_{22}$. That is, the first syndrome SDR_M may be generated by $S_{M0} = HS_{22} r^T$. Since the second parity sub matrix $HS_{22}$ includes a plurality of unit sub matrixes ISM1,1~ISM1,(k+1) and a plurality of zero sub matrixes ZSM1,1~ZSM1,(k+1), each of the unit sub matrixes ISM1,1~ISM1,(k+1) and the zero sub matrixes ZSM1,1~ZSM1,(k+1) includes p×p elements, and the unit sub matrixes ISM1,1~ISM1,(k+1) and the zero sub matrixes ZSM1,1~ZSM1,(k+1) are alternatingly arranged, a number of XOR operations for generating the first syndrome SDR_M may be reduced. Therefore, complexity of calculation for generating the decoding status flag DSF may be reduced.

FIG. 16 illustrates operations of the shifted error magnitude syndrome generator and the summer in the ECC decoder of FIG. 14.

Referring to FIGS. 14 and 16, the shifted error magnitude syndrome generator 152 may generate the second syndrome SDR_MS by performing a matrix-multiplication operation on the read codeword CW2 and the third parity sub matrix HS$_{23}$. The second syndrome SDR_MS may be obtained by S$_{MS}$=HS$_{23}$r$^T$. The summer 156 may sum the first syndrome SDR_M and the second syndrome SDR_MS to generate the decision syndrome SDR_D. That is, the decision syndrome SDR_D may be obtained by S$_D$=S$_{M0}$+S$_{MS}$.

Figures 17, 18:
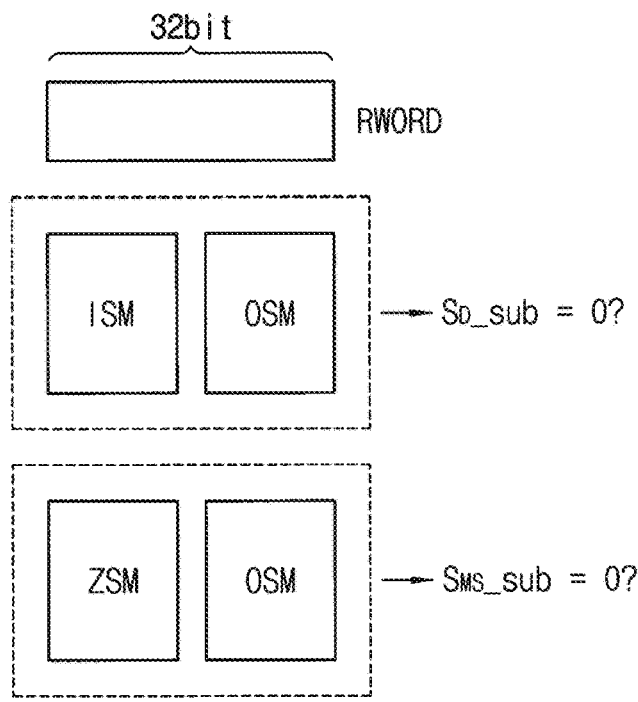
FIG. 17 illustrates examples of read word, an associated sub syndrome of the decision syndrome and an associated sub syndrome of the second syndrome which correspond to one data chip.
FIG. 18 illustrates that the ECC decoder in FIG. 14 determines a type of errors based on the decision syndrome and the second syndrome.

FIG. 17 illustrates examples of read word, an associated sub syndrome of the decision syndrome and an associated sub syndrome of the second syndrome which correspond to one data chip.

Referring to FIG. 17, an associated sub syndrome S$_D$_sub of the decision syndrome S$_D$ may be obtained by performing a matrix-multiplication operation on a 32-bit read word RWORD S$_{MS}$ in the codeword CW2 which corresponds to one data chip, and the unit sub matrix ISM (e.g., the unit sub matrix ISM1,1) of the second parity sub matrix HS$_{22}$ and the offset sun matrix OSM of the third parity sub matrix HS$_{23}$, and an associated sub syndrome S$_{MS}$_sub of the second syndrome S$_{MS}$ may be obtained by performing a matrix-multiplication operation on the 32-bit read word RWORD S$_{MS}$ in the codeword CW2 and the zero sub matrix ZSM (e.g., the zero sub matrix ZSM2,1) and the offset sub matrix OSM of the third parity sub matrix HS$_{23}$.

FIG. 18 illustrates that the ECC decoder in FIG. 14 may determine a type of errors based on the decision syndrome and the second syndrome.

Referring to FIG. 18, the ECC decoder 150 may determine whether a data set read from a data chip includes correctable errors based on whether the sub syndrome S$_D$_sub of the decision syndrome S$_D$, corresponding to the data chip, has a zero value.

The sub syndrome S$_D$_sub of the decision syndrome S$_D$ having a zero value and sub syndrome S$_{MS}$_sub of the second syndrome Sims having a zero value indicate the data set read from the corresponding data chip does not include errors, which is represented as 'NE'. The sub syndrome S$_D$_sub of the decision syndrome S$_D$ having a zero value and sub syndrome S$_{MS}$_sub of the second syndrome Sims having a non-zero value indicate the data set read from the corresponding data chip includes uncorrectable errors, which is represented as 'UE'. The sub syndrome S$_D$_sub of the decision syndrome S$_D$ having a non-zero value indicates the data set read from the corresponding data chip includes correctable errors, which is represented as 'CE'.

Figure 19:
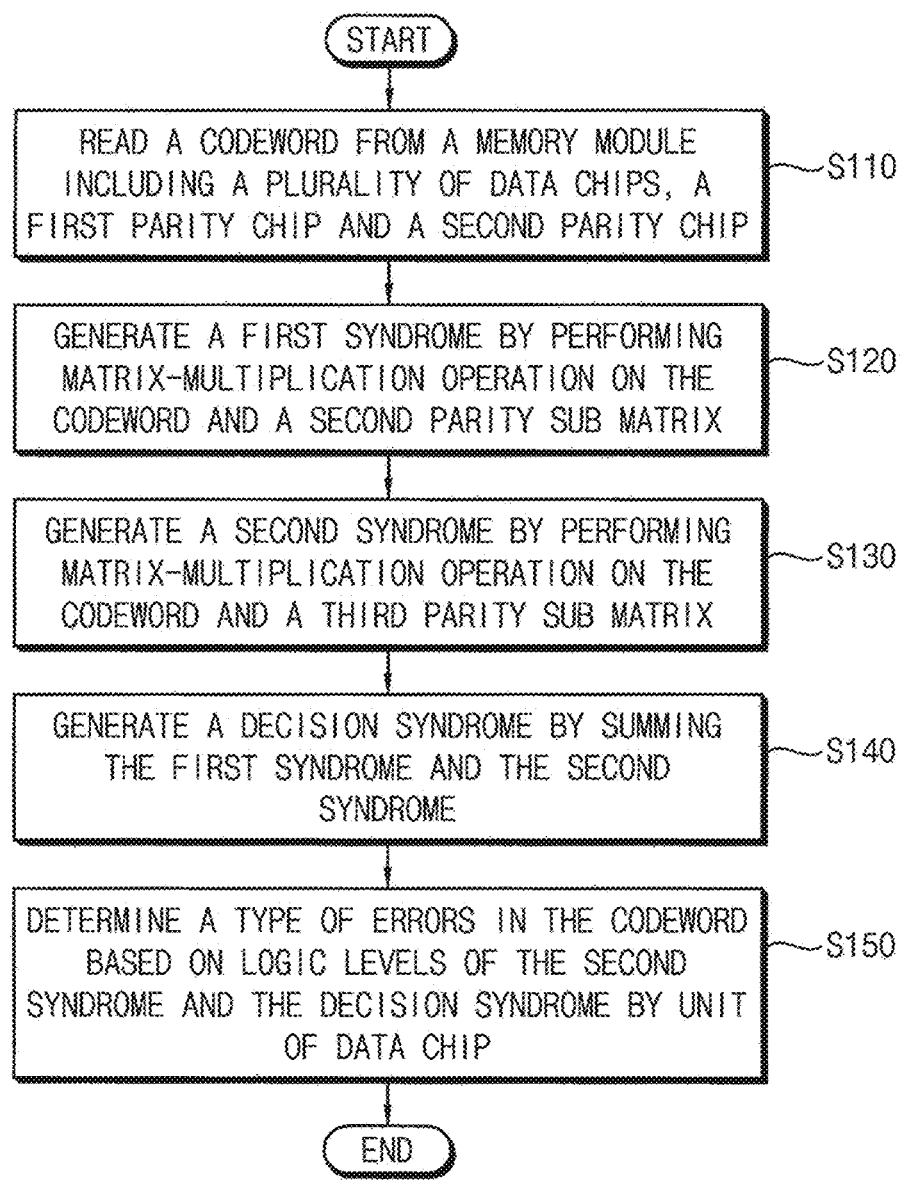
FIG. 19 is a flow chart illustrating a method of determining a type of errors in a memory controller according to some example embodiments.

FIG. 19 is a flow chart illustrating a method of determining a type of errors in a memory controller according to some example embodiments.

Referring to FIGS. 1 through 19, there is provided a method of determining a type of errors in a memory controller 100 that controls a memory module MM including a plurality of data chips, a first parity chip and a second parity chip. According to the method, the memory controller 100 may read a codeword CW2 including a user data set, meta data and a parity data set from the plurality of data chips, the first parity chip and the second parity chip (operation S110).

An ECC decoder 150 of an ECC engine 130 in the memory controller 100 may generate a first syndrome SDR_M by performing a matrix-multiplication operation on the read codeword CW2 and the second parity sub matrix HS$_{22}$ (operation S120).

The ECC decoder 150 may generate a second syndrome SDR_MS by performing a matrix-multiplication operation on the read codeword CW2 and the third parity sub matrix HS$_{23}$ (operation S130).

The ECC decoder 150 may generate a decision syndrome SDR_D by summing the first syndrome SDR_M and the second syndrome SDR_MS (operation S140).

The ECC decoder 150 may determine a type of errors of the user data set in the codeword CW2 based on logic levels of the decision syndrome SDR_D and the second syndrome SDR_MS by unit of a data chip (e.g., for each data chip) (operation S150).

The ECC decoder 150 may output to the CPU 110 the decoding status flag DSF indicating that user data set of the read codeword CW2 includes uncorrectable errors or does not include errors in response to the decision syndrome SDR_D having a zero logic level. The ECC decoder 150 may output to the CPU 110 the decoding status flag DSF indicating that user data set of the read codeword CW2 includes correctable errors in response to the decision syndrome SDR_D having a non-zero logic level, correct errors of the user data set and output the corrected user data set.

Figure 20:
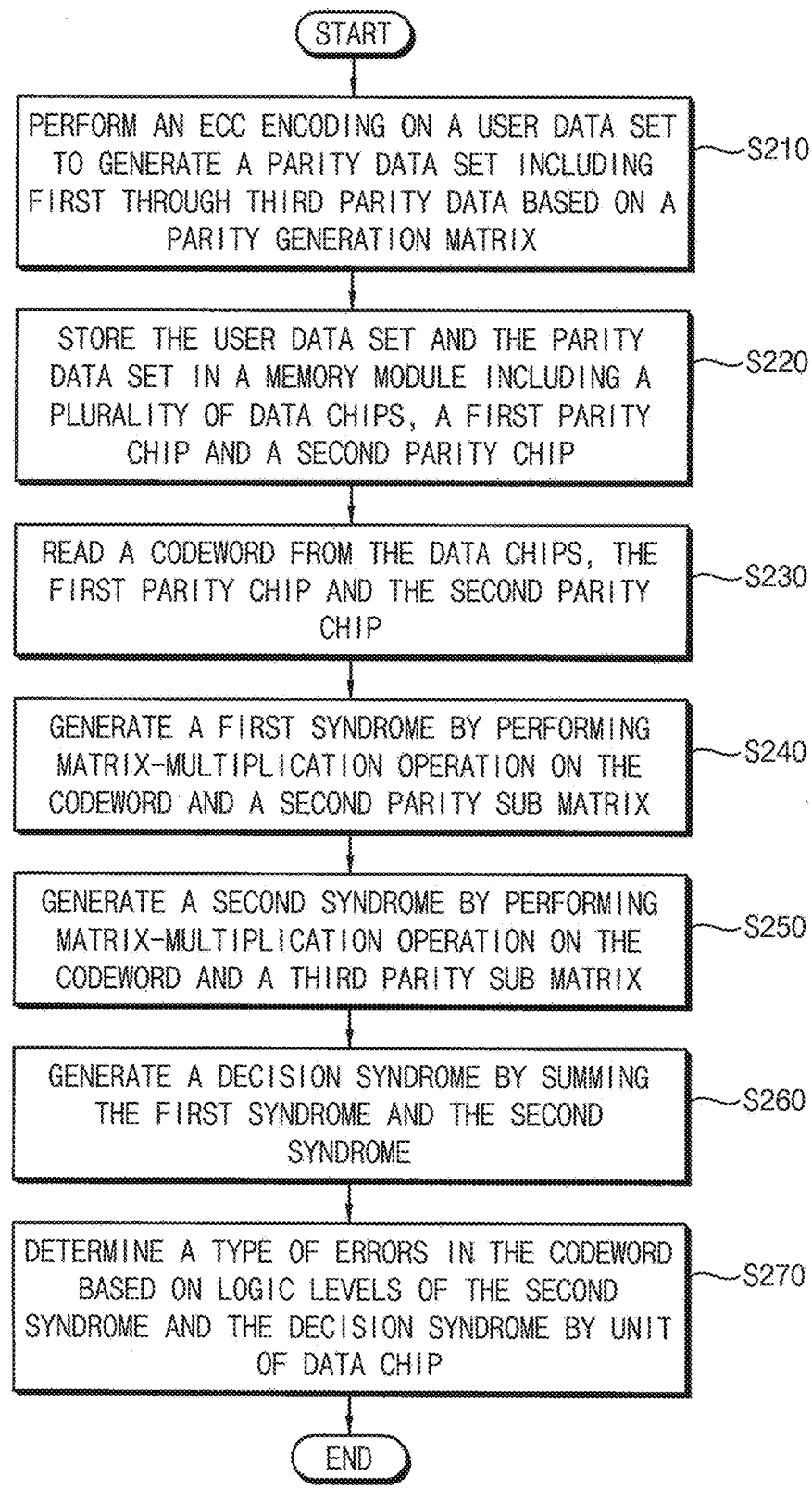
FIG. 20 is a flow chart illustrating a method of operating a memory system including a memory module and a memory controller to control the memory module according to some example embodiments.

FIG. 20 is a flow chart illustrating a method of operating a memory system including a memory module and a memory controller to control the memory module according to some example embodiments.

Referring to FIGS. 1 through 18 and 20, there is provided a method of operating a memory system 20 that includes a memory module MM including a plurality of data chips, a first parity chip and a second parity chip, and a memory controller 100 that may control the memory module MM. According to the method, an ECC encoder 140 of an ECC engine 130 in the memory controller 100 may perform an ECC encoding on a user data set and meta data based on a parity generation matrix to generate a parity data set including first parity data (e.g., the error locator parity data PRTL), second parity data (e.g., the first error magnitude parity data PRTM1) and third parity data (e.g., the second error magnitude parity data PRTM2) (operation S210).

The memory controller 100 may store a codeword CW1 including the user data set, the meta data and the parity data set in the plurality of data chips, the first parity chip and the second parity chip (operation S220).

The memory controller 100 may read a codeword CW2 including the user data set, the meta data and the parity data set from the plurality of data chips, the first parity chip and the second parity chip (operation S230).

An ECC decoder 150 of the ECC engine 130 may generate a first syndrome SDR_M by performing a matrix-multiplication operation on the read codeword CW2 and the second parity sub matrix HS$_{22}$ (operation S240).

The ECC decoder 150 may generate a second syndrome SDR_MS by performing a matrix-multiplication operation on the read codeword CW2 and the third parity sub matrix HS$_{23}$ (operation S250).

The ECC decoder 150 may generate a decision syndrome SDR_D by summing the first syndrome SDR_M and the second syndrome SDR_MS (operation S260).

The ECC decoder 150 may determine a type of errors of the user data set in the codeword CW2 based on logic levels of the decision syndrome SDR_D and the second syndrome SDR_MS by unit of a data chip (operation S270).

Figure 21:
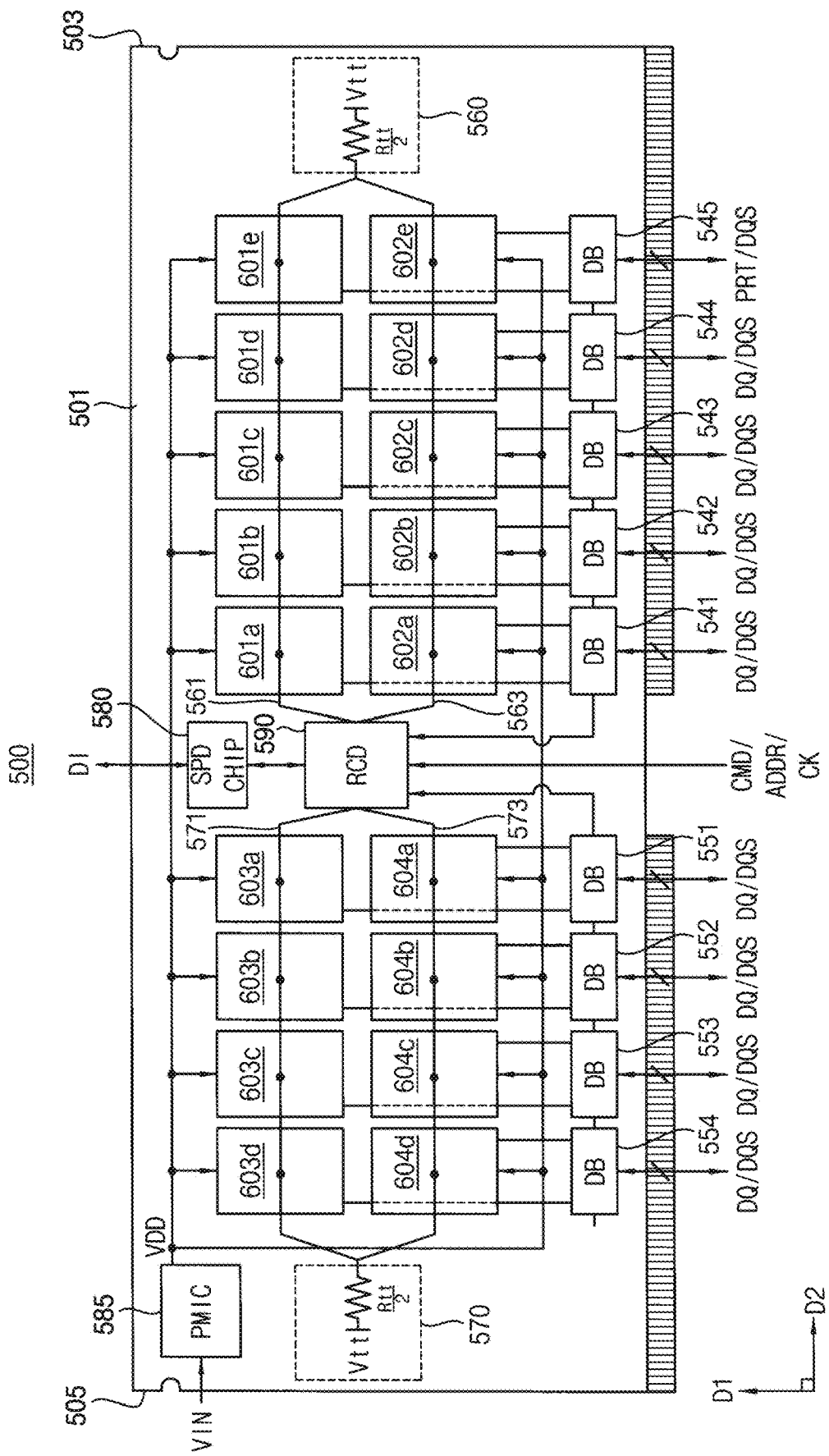
FIG. 21 is a block diagram illustrating a memory module that may be employed by the memory system according to some example embodiments.

FIG. 21 is a block diagram illustrating a memory module that may be employed by the memory system according to some example embodiments.

Referring to FIG. 21, a memory module 500 includes the control device 590 (RCD, registered clock driver) disposed in or mounted on a circuit board 501, a plurality of semiconductor memory devices 601a~601e, 602a~602e, 603a~603d, and 604a~604d, a plurality of data buffers 541~545 and 551~555, module resistance units 560 and 570, a serial present detect (SPD) chip 580, and/or a Power Management Integrated Circuit (PMIC) 585.

The control device 590 may control the semiconductor memory devices 601a~601e, 602a~602e, 603a~603d, and 604a~604d, and the PMIC 585, under control of the memory controller 100. For example, the control device 590 may receive an address ADDR, a command CMD, and/or a clock signal CK from the memory controller 100.

The SPD chip 580 may be a programmable read only memory (PROM) (e.g., an electrically erasable PROM (EEPROM)). The SPD chip 580 may include initial information and/or device information DI of the memory module 500. In some example embodiments, the SPD chip 580 may include the initial information and/or the device information DI such as a module form, a module configuration, a storage capacity, a module type, an execution environment, and/or the like of the memory module 500.

When a memory system including the memory module 500 is booted up, the memory controller 100 may read the device information DI from the SPD chip 580 and may recognize the memory module 500 based on the device information DI. The memory controller 100 may control the memory module 500 based on the device information DI from the SPD chip 580. For example, the memory controller 100 may recognize a type of the semiconductor memory devices included in the memory module 500 based on the device information DI from the SPD chip 580.

Here, the circuit board 501 which is a printed circuit board may extend in a second direction D2, perpendicular to a first direction D1, between a first edge portion 503 and a second edge portion 505. The first edge portion 503 and the second edge portion 505 may extend in the first direction D1.

The control device 590 may be disposed on a center of the circuit board 501. The plurality of semiconductor memory devices 601a~601e, 602a~602e, 603a~603d, and 604a~604d may be arranged in a plurality of rows between the control device 590 and the first edge portion 503, and between the control device 590 and the second edge portion 505. According to some example embodiments, operations described herein as being performed by the control device 590 may be performed by processing circuitry.

In this case, the semiconductor memory devices 601a~601e and 602a~602e may be arranged along a plurality of rows between the control device 590 and the first edge portion 503. The semiconductor memory devices 603a~603d and 604a~604d may be arranged along a plurality of rows between the control device 590 and the second edge portion 505. The semiconductor memory devices 601a~601d, 602a~602d, 603a~603d, and 604a~604d may be referred to as data chips, and the semiconductor memory devices 601e and 602e may be referred to as first and second parity chips, respectively.

Each of the plurality of semiconductor memory devices 601a~601e, 602a~602e, 603a~603d, and 604a~604d may be coupled to a corresponding one of the data buffers 541~545 and 551~554 through a data transmission line for receiving/transmitting the data signal DQ and the data strobe signal DQS.

The control device 590 may provide a command/address signal (e.g., CA) to the semiconductor memory devices 601a~601e through a command/address transmission line 561, and may provide a command/address signal to the semiconductor memory devices 602a~602e through a command/address transmission line 563.

In addition, the control device 590 may provide a command/address signal to the semiconductor memory devices 603a~603d through a command/address transmission line 571, and may provide a command/address signal to the semiconductor memory devices 604a~604d through a command/address transmission line 573.

The command/address transmission lines 561 and 563 may be connected in common to the module resistance unit 560 disposed to be adjacent to the first edge portion 503, and the command/address transmission lines 571 and 573 may be connected in common to the module resistance unit 570 disposed to be adjacent to the second edge portion 505.

Each of the module resistance units 560 and 570 may include a termination resistor Rtt/2 connected to a termination voltage Vtt. In this case, an arrangement of the module resistance units 560 and 570 may reduce the number of the module resistance units, thus reducing an area where termination resistors are disposed.

In addition, each of the plurality of semiconductor memory devices 601a~601e, 602a~602e, 603a~603d, and 604a~604d may be a DRAM device.

The SPD chip 580 is disposed to be adjacent to the control device 590 and the PMIC 585 may be disposed between the semiconductor memory device 603d and the second edge portion 505. The PMIC 585 may generate the power supply voltage VDD based on the input voltage VIN and may provide the power supply voltage VDD to the semiconductor memory devices 601a~601e, 602a~602e, 603a~603d, and 604a~604d.

Although it is illustrated as the PMIC 585 is disposed to be adjacent to the second edge portion 505 in FIG. 21, the PMIC 585 may be disposed in a central portion of the circuit board 501 to be adjacent to the control device 590 in some example embodiments.

Figure 22:
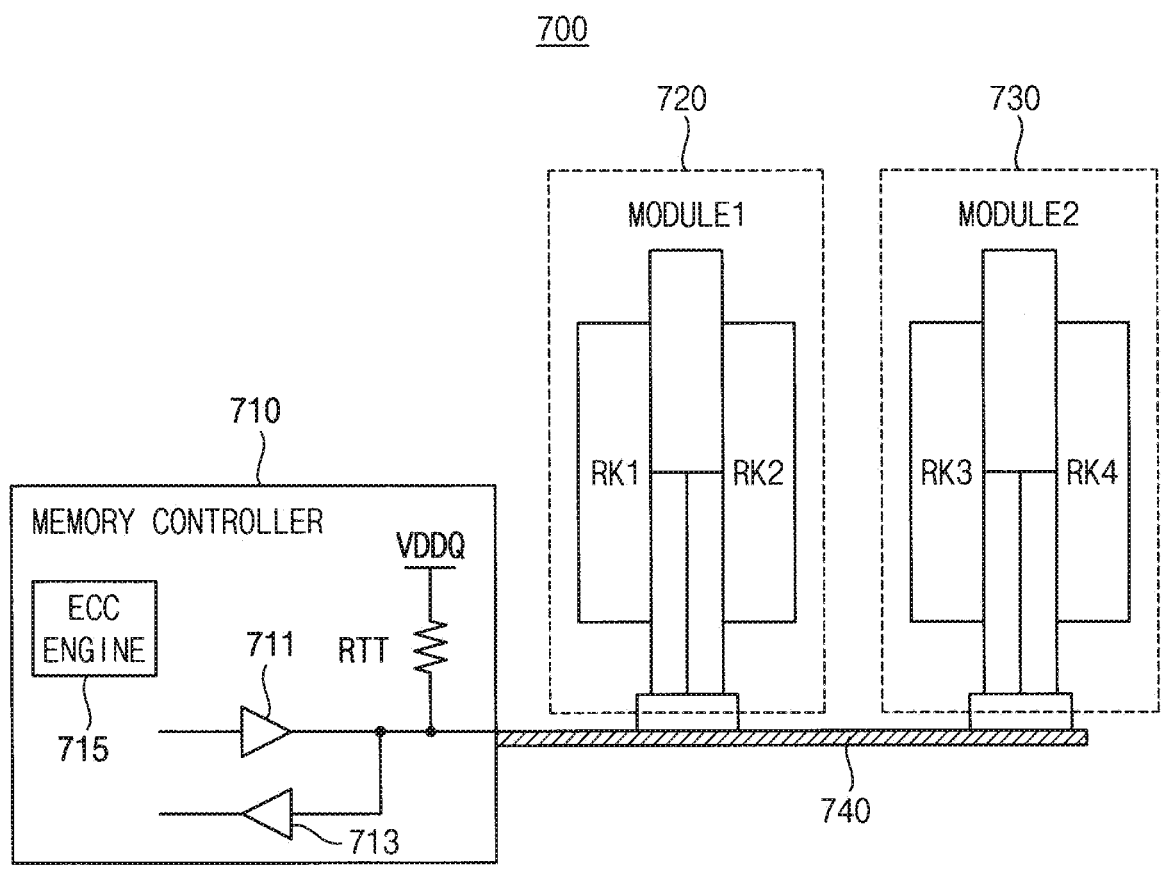
FIG. 22 is a block diagram illustrating a memory system having quad-rank memory modules according to some example embodiments.

FIG. 22 is a block diagram illustrating a memory system having quad-rank memory modules according to some example embodiments.

Referring to FIG. 22, a memory system 700 may include a memory controller 710 and/or memory modules 720 and 730. While two memory modules are depicted in FIG. 22, more or fewer memory modules may be included in the memory system 700, according to some example embodiments.

The memory controller 710 may control a memory module 720 and/or 730 so as to perform a command supplied from a processor and/or host. The memory controller 710 may be implemented using processing circuitry (e.g., a processor) and/or may be implemented with a host, an application processor or a system-on-a-chip (SoC).

For signal integrity, a source termination may be implemented with a resistor RTT on a bus 740 of the memory controller 710. The resistor RTT may be coupled to a power supply voltage VDDQ. The memory controller 710 may include a transmitter 711, that may transmit a signal to at least one of the memory modules 720 and/or 730, and a receiver 713 that may receive a signal from at least one of the memory modules 720 and/or 730. The memory controller 710 may include an ECC engine 715 and the ECC engine 715 may employ the ECC engine 130 of FIG. 6.

Therefore, the ECC engine 715 includes an ECC encoder and an ECC decoder, and the ECC decoder may perform an ECC decoding on a read codeword from at least one of the memory modules 720 and/or 730 using a first portion of the parity check matrix to generate a first syndrome and a second syndrome, may determine a type of errors in the read codeword based on the second syndrome and a decision syndrome corresponding to sum of the first syndrome and the second syndrome.

If the read codeword includes correctable errors, the ECC decoder may generate a third syndrome indicating a position of the correctable error based on a second portion of the parity check matrix and may correct the correctable errors based on the third syndrome. Therefore, the ECC decoder may increase speed and efficiency of error determining.

The memory modules 720 and 730 may be referred to as a first memory module 720 and a second memory module 730. The first memory module 720 and the second memory module 730 may be coupled to the memory controller 710 through the bus 740. Each of the first memory module 720 and the second memory module 730 may correspond to the memory module MM in FIG. 1. The first memory module 720 may include memory ranks RK1 and RK2, and the second memory module 730 may include memory ranks RK3 and RK4. While each memory module is depicted as including two memory ranks in FIG. 22, each memory module may include more or fewer memory ranks, according to some example embodiments.

Each of the first memory module 720 and the second memory module 730 may include a plurality of data chips, a first parity chip and a second parity chip.

Figure 23:
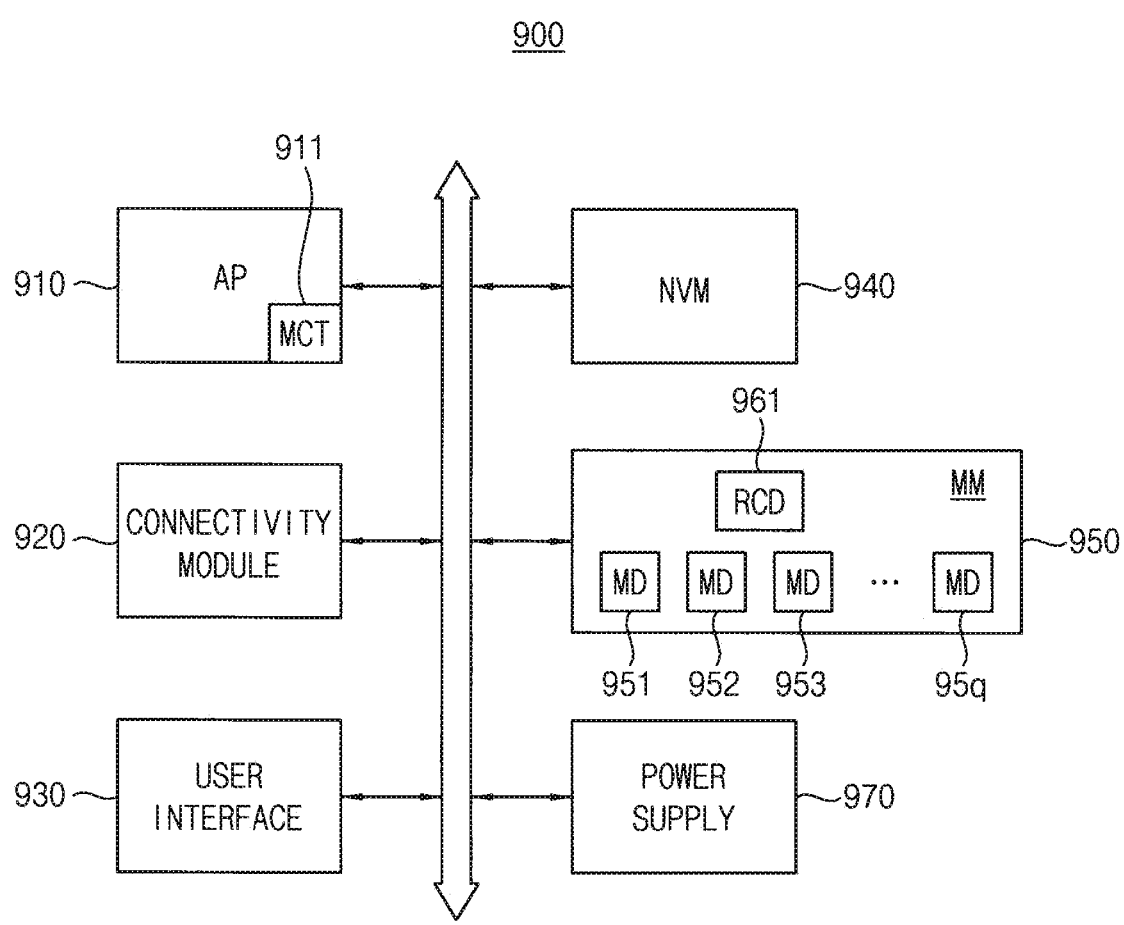
FIG. 23 is a block diagram illustrating a mobile system 900 including a memory module according to some example embodiments.

FIG. 23 is a block diagram illustrating a mobile system 900 including a memory module according to some example embodiments.

Referring to FIG. 23, a mobile system 900 may include processing circuitry 910 (e.g., an application processor, a memory controller (MCT), and/or an application processor including an MCT 911), a connectivity module 920, a memory module 950, a nonvolatile memory device 940, a user interface 930, and/or a power supply 970.

The processing circuitry 910 may execute applications, such as a web browser, a game application, a video player, etc. The connectivity module 920 may perform wired and/or wireless communication with an external device.

The memory module (MM) 950 may store data processed by the processing circuitry 910 and/or operate as a working memory. The memory module 950 may include a plurality of semiconductor memory devices (MD) 951, 952, 953, and 95q (where q is a positive integer greater than three), and/or a control device 961. According to some example embodiments, operations described herein as being performed by the control device 961 may be performed by processing circuitry.

The semiconductor memory devices 951, 952, 953, and 95q may include a plurality of data chips, a first parity chip and a second parity chip. Therefore, the processing circuitry (e.g., the MCT) may perform an ECC decoding on a read codeword from the memory modules 950 using a first portion of a parity check matrix to generate a first syndrome and a second syndrome, may selectively determine a type of errors in the codeword based on the second syndrome and a decision syndrome corresponding to sum of the first syndrome and the second syndrome.

The mobile system 900 or components of the mobile system 900 may be mounted using various types of packages.

Some example embodiments may be applied to various systems including a memory module and a memory controller that includes an ECC engine.

The various operations of methods described above may be performed by any suitable device capable of performing the operations, such as processing circuitry. For example, the operations of methods described above may be performed by various hardware and/or software implemented in some form of hardware (e.g., processor, ASIC, etc.).

The software may comprise an ordered listing of executable instructions for implementing logical functions, and may be embodied in any "processor-readable medium" for use by or in connection with an instruction execution system, apparatus, or device, such as a single or multiple-core processor or processor-containing system.

The blocks or operations of a method or algorithm and functions described in connection with some example embodiments disclosed herein may be embodied directly in hardware, in a software module executed by a processor, or in a combination of the two. If implemented in software, the functions may be stored on or transmitted over as one or more instructions or code on a tangible, non-transitory computer-readable medium. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD ROM, or any other form of storage medium known in the art.

While the present disclosure has been particularly shown and described with reference to some example embodiments thereof, it will be understood by those of ordinary skill in the art that various changes in form and detail may be made therein without departing from the spirit and scope of the present disclosure as defined by the following claims.

What is claimed is:

1. A memory controller configured to control a memory module, the memory controller comprising:
   processing circuitry configured to,
      perform ECC decoding on a read codeword from the memory module using a first portion of a parity check matrix to generate a first syndrome and a second syndrome,
      determine a type of error in the read codeword based on the second syndrome and a decision syndrome, the decision syndrome corresponding to a sum of the first syndrome and the second syndrome, and
      output a decoding status flag indicating the type of error.

2. The memory controller of claim 1, wherein the processing circuitry is configured to:
   output the decoding status flag indicating that a user data set of the read codeword includes a correctable error in response to the decision syndrome having a non-zero logic level;
   generate a third syndrome indicating a position of the correctable error based on a second portion of the parity check matrix and the read codeword; and
   correct the correctable error using the third syndrome to obtain a corrected user data set.

3. The memory controller of claim 1, wherein the processing circuitry is configured to output the decoding status flag indicating that a user data set of the read codeword does not include errors in response to the decision syndrome having a zero logic level and the second syndrome having a zero logic level.

4. The memory controller of claim 1, wherein the processing circuitry is configured to output the decoding status flag indicating that a user data set of the read codeword includes uncorrectable errors in response to the decision syndrome having a zero logic level and the second syndrome having a non-zero logic level.

5. The memory controller of claim 1, wherein the read codeword includes a user data set, meta data associated with the user data set, error locator parity data, first error magnitude parity data and second error magnitude parity data.

6. The memory controller of claim 5, wherein
   the memory module includes a plurality of data chips, a first parity chip and a second parity chip;
   the user data set is read from the plurality of data chips;

the meta data and the error locator parity data are read from the first parity chip; and the first error magnitude parity data and the second error magnitude parity data are read from the second parity chip.

7. The memory controller of claim 1, wherein the parity check matrix includes a first parity sub matrix, a second parity sub matrix and a third parity sub matrix.

8. The memory controller of claim 7, wherein
the second parity sub matrix includes a plurality of unit sub matrixes and a plurality of first zero sub matrixes, each of the plurality of unit sub matrixes and the plurality of first zero sub matrixes having p×p elements, the plurality of unit sub matrixes and the plurality of first zero sub matrixes being alternatingly arranged, and p being a natural number greater than one;
the third parity sub matrix includes a plurality of second zero sub matrixes and a plurality of first offset sub matrixes, each of the plurality of second zero sub matrixes and the plurality of first offset sub matrixes having p×p elements, the plurality of second zero sub matrixes and the plurality of first offset sub matrixes being alternatingly arranged;
the first parity sub matrix includes a plurality of second offset sub matrixes and two third zero sub matrixes, the plurality of second offset sub matrixes being different from one another and corresponding to a plurality of data chips included in the memory module; and
the first portion of the parity check matrix includes the second parity sub matrix and the third parity sub matrix.

9. The memory controller of claim 8, wherein the processing circuitry is configured to:
generate the first syndrome by performing a matrix-multiplication operation on the read codeword and the second parity sub matrix;
generate the second syndrome by performing a matrix-multiplication operation on the read codeword and the third parity sub matrix; and
generate the decision syndrome by summing the first syndrome and the second syndrome.

10. The memory controller of claim 9, wherein the processing circuitry is configured to generate a third syndrome indicating a position of a correctable error by performing a matrix-multiplication operation on the read codeword and the first parity sub matrix in response to the decision syndrome having a non-zero logic level.

11. The memory controller of claim 1, wherein the processing circuitry is configured to:
perform ECC encoding on a user data set and meta data to generate error locator parity data, first error magnitude parity data and second error magnitude parity data using a parity generation matrix; and
output an output codeword to the memory module, the output codeword including the user data set, the meta data, the error locator parity data, the first error magnitude parity data and the second error magnitude parity data.

12. The memory controller of claim 11, wherein the parity generation matrix includes a first parity sub matrix, a second parity sub matrix and a third parity sub matrix.

13. The memory controller of claim 12, wherein the processing circuitry is configured to:
generate the error locator parity data by performing ECC encoding on the user data set and the meta data using the first parity sub matrix;

generate the first error magnitude parity data by performing a matrix-multiplication operation on the second parity sub matrix, the user data set, the meta data and the error locator parity data; and
generate the second error magnitude parity data by performing a matrix-multiplication operation on the third parity sub matrix, the user data set, the meta data and the error locator parity data.

14. The memory controller of claim 12, wherein
the second parity sub matrix includes a plurality of unit sub matrixes and a plurality of first zero sub matrixes, each of the plurality of unit sub matrixes and the plurality of first zero sub matrixes having p×p elements, the plurality of unit sub matrixes and the plurality of first zero sub matrixes being alternatingly arranged, and p being a natural number greater than one;
the third parity sub matrix includes a plurality of second zero sub matrixes and a plurality of first offset sub matrixes, each of the plurality of second zero sub matrixes and the plurality of first offset sub matrixes having p×p elements, the plurality of second zero sub matrixes and the plurality of first offset sub matrixes being alternatingly repeated; and
the first parity sub matrix includes a plurality of second offset sub matrixes and two third zero sub matrixes, the plurality of second offset sub matrixes being different from one another and corresponding to a plurality of data chips included in the memory module.

15. A memory system comprising:
a memory module; and
a memory controller including processing circuitry, the processing circuitry configured to,
perform ECC decoding on a read codeword from the memory module using a first portion of a parity check matrix to generate a first syndrome and a second syndrome,
determine a type of error in the read codeword based on the second syndrome and a decision syndrome, the decision syndrome corresponding to a sum of the first syndrome and the second syndrome, and
output a decoding status flag indicating the type of error.

16. The memory system of claim 15, wherein the processing circuitry is configured to:
output the decoding status flag indicating that a user data set of the read codeword includes a correctable error in response to the decision syndrome having a non-zero logic level;
generate a third syndrome indicating a position of the correctable error based on a second portion of the parity check matrix and the read codeword; and
correct the correctable error using the third syndrome to obtain a corrected user data set.

17. The memory system of claim 15, wherein the processing circuitry is configured to output the decoding status flag indicating that a user data set of the read codeword does not include errors in response to the decision syndrome having a zero logic level and the second syndrome having a zero logic level.

18. The memory system of claim 15, wherein the processing circuitry is configured to output the decoding status flag indicating that a user data set of the read codeword includes uncorrectable errors in response to the decision syndrome having a zero logic level and the second syndrome having a non-zero logic level.

19. The memory system of claim 15, wherein
the parity check matrix includes a first parity sub matrix, a second parity sub matrix and a third parity sub matrix;
the second parity sub matrix includes a plurality of unit sub matrixes and a plurality of first zero sub matrixes, each of the plurality of unit sub matrixes and the plurality of first zero sub matrixes having p×p elements, the plurality of unit sub matrixes and the plurality of first zero sub matrixes being alternatingly arranged, and p being a natural number greater than one;
the third parity sub matrix includes a plurality of second zero sub matrixes and a plurality of first offset sub matrixes, each of the plurality of second zero sub matrixes and the plurality of first offset sub matrixes having p×p elements, the plurality of second zero sub matrixes and the plurality of first offset sub matrixes being alternatingly arranged;
the first parity sub matrix includes a plurality of second offset sub matrixes and two third zero sub matrixes, the plurality of second offset sub matrixes being different from one another and corresponding to a plurality of data chips included in the memory module; and
the first portion of the parity check matrix includes the second parity sub matrix and the third parity sub matrix.

20. A memory controller configured to control a memory module, the memory controller comprising:
processing circuitry configured to,
perform ECC encoding on a user data set and meta data to generate error locator parity data, first error magnitude parity data and second error magnitude parity data using a parity generation matrix,
output an output codeword to the memory module, the output codeword including the user data set, the meta data, the error locator parity data, the first error magnitude parity data and the second error magnitude parity data,
perform ECC decoding on a read codeword from the memory module using a first portion of a parity check matrix to generate a first syndrome and a second syndrome,
determine a type of error in the read codeword based on the second syndrome and a decision syndrome, the decision syndrome corresponding to a sum of the first syndrome and the second syndrome, and
output a decoding status flag indicating the type of error.

\* \* \* \* \*